US010497831B2

(12) United States Patent
Obuchi et al.

(10) Patent No.: US 10,497,831 B2
(45) Date of Patent: Dec. 3, 2019

(54) SEMICONDUCTOR LIGHT EMITTING ELEMENT AND MANUFACTURING METHOD THEREOF

(71) Applicant: ROHM CO., LTD., Kyoto (JP)

(72) Inventors: Hirotaka Obuchi, Kyoto (JP); Kazuaki Tsutsumi, Kyoto (JP); Hideaki Anzai, Kyoto (JP); Takao Fujimori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/610,983

(22) Filed: Jun. 1, 2017

(65) Prior Publication Data
US 2017/0352781 A1    Dec. 7, 2017

(30) Foreign Application Priority Data
Jun. 2, 2016    (JP) .................. 2016-111145

(51) Int. Cl.
H01L 33/00    (2010.01)
H01L 33/10    (2010.01)
(Continued)

(52) U.S. Cl.
CPC .......... H01L 33/10 (2013.01); H01L 33/0075 (2013.01); H01L 33/0095 (2013.01);
(Continued)

(58) Field of Classification Search
CPC ..... H01L 33/10; H01L 33/32; H01L 33/0075; H01L 33/60; H01L 33/0095; H01L 33/44; H01L 33/486; H01L 33/0079; H01L 33/46; H01L 33/007; H01S 5/02469; H01S 5/02256; H01S 5/0217; H01S 5/0206; H01S 5/02296; H01S 5/02; H01S 5/028;
(Continued)

(56) References Cited

U.S. PATENT DOCUMENTS

2004/0113156 A1* 6/2004 Tamura ............... H01L 33/42
257/79
2006/0054905 A1* 3/2006 Schwach ............. H01L 33/08
257/89
(Continued)

FOREIGN PATENT DOCUMENTS

JP    2013-165186 A    8/2013
JP    2013165186    *  8/2013    ......... H01L 21/301

Primary Examiner — Caridad Everhart
(74) Attorney, Agent, or Firm — Rabin & Berdo, P.C.

(57) ABSTRACT

A semiconductor light emitting element is disclosed. The element includes a substrate including a first surface, a second surface opposite to the first surface, and a side surface that connects the first surface and the second surface; a semiconductor layer formed on the first surface of the substrate and configured to generate light; and a light reflective layer formed on the second surface of the substrate to cover an entire region of the second surface of the substrate and configured to reflect the light generated by the semiconductor layer toward the semiconductor layer. A modified layer, which has a physical property different from that of the other portion of the substrate, is formed on the side surface of the substrate to be spaced apart from the first surface toward the second surface by altering a material forming the substrate.

28 Claims, 19 Drawing Sheets

(51) Int. Cl.
*H01L 33/32* (2010.01)
*H01L 33/44* (2010.01)
*H01L 33/46* (2010.01)
*H01L 33/48* (2010.01)

(52) U.S. Cl.
CPC .............. *H01L 33/32* (2013.01); *H01L 33/44* (2013.01); *H01L 33/46* (2013.01); *H01L 33/486* (2013.01)

(58) Field of Classification Search
CPC .... H01S 5/0273; H01S 5/0202; H01S 5/4043; H01S 5/005
See application file for complete search history.

(56) References Cited

U.S. PATENT DOCUMENTS

| | | | |
|---|---|---|---|
| 2006/0189098 A1* | 8/2006 | Edmond | H01L 33/007 438/460 |
| 2008/0315176 A1* | 12/2008 | Takeuchi | H01L 33/0079 257/13 |
| 2013/0023076 A1* | 1/2013 | Uchiyama | H01L 33/0095 438/29 |
| 2013/0122619 A1* | 5/2013 | Aikawa | H01L 33/0095 438/29 |
| 2014/0353705 A1* | 12/2014 | Kamikawa | H01L 33/007 257/98 |
| 2015/0118775 A1* | 4/2015 | Narita | H01L 33/0095 438/33 |

* cited by examiner

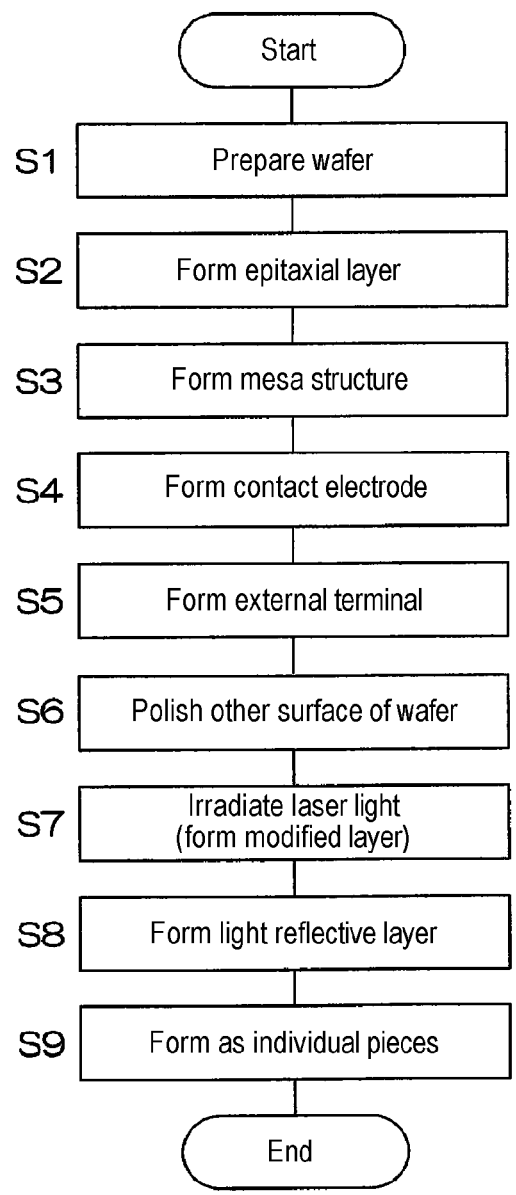

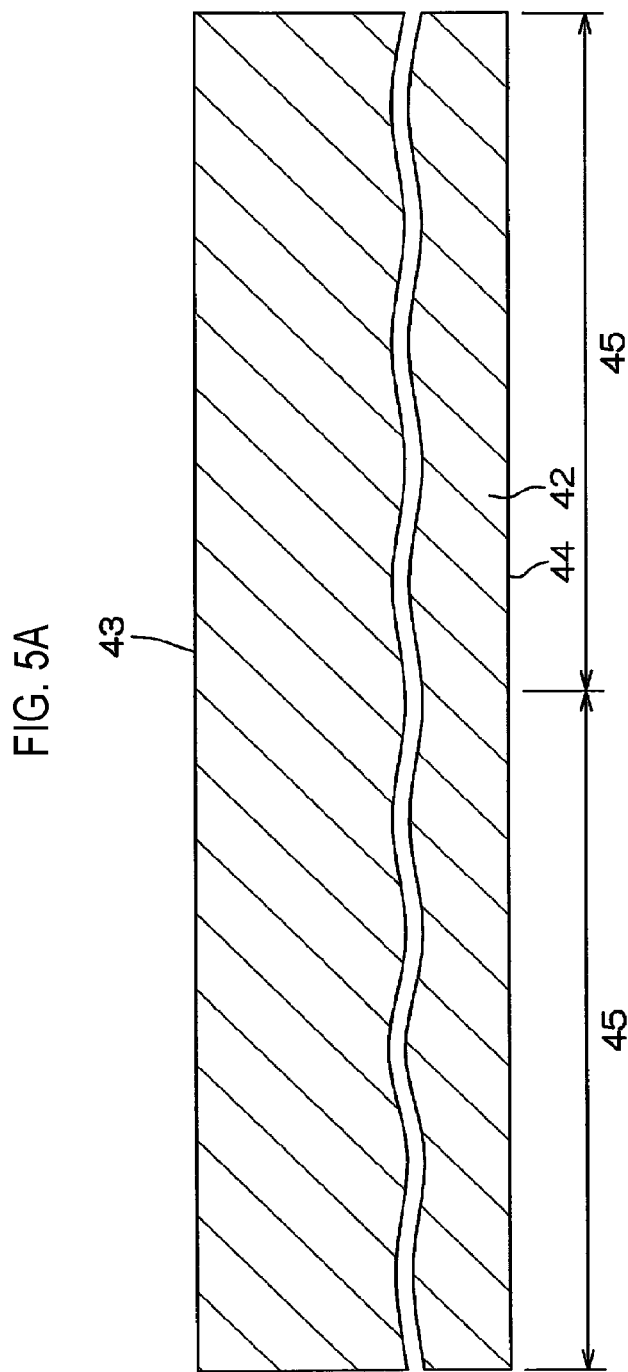

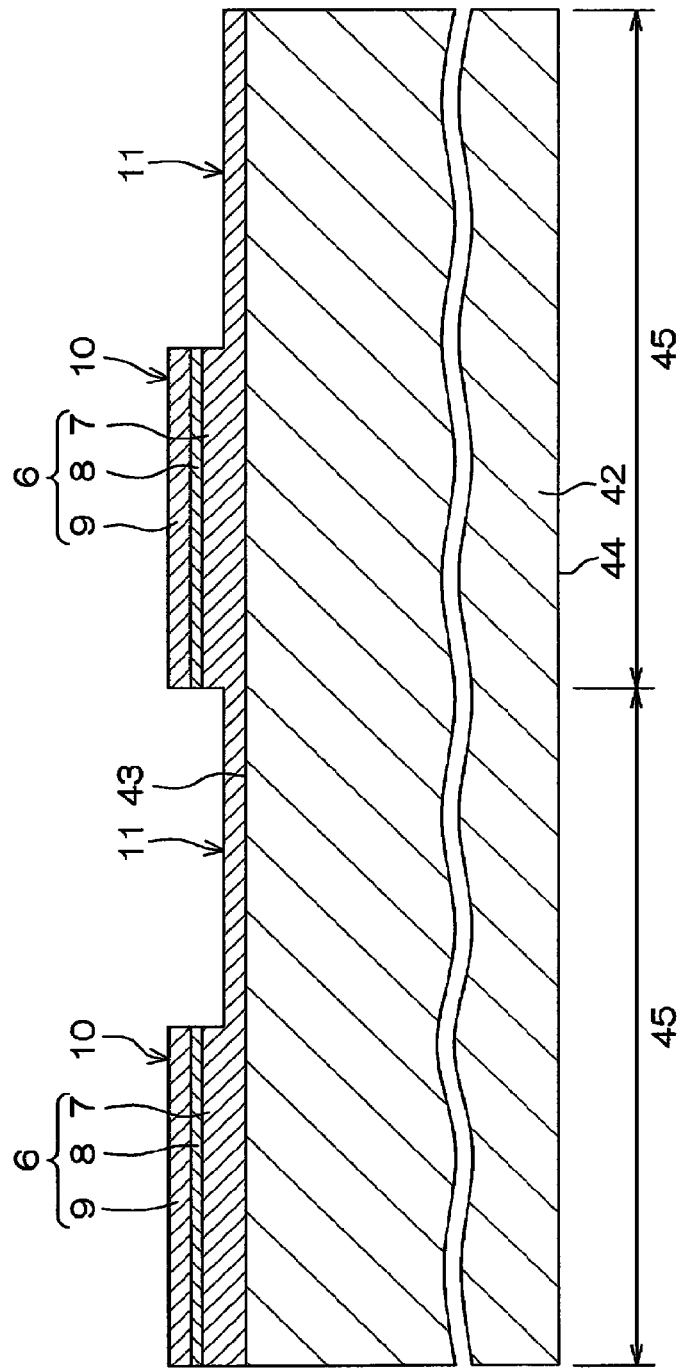

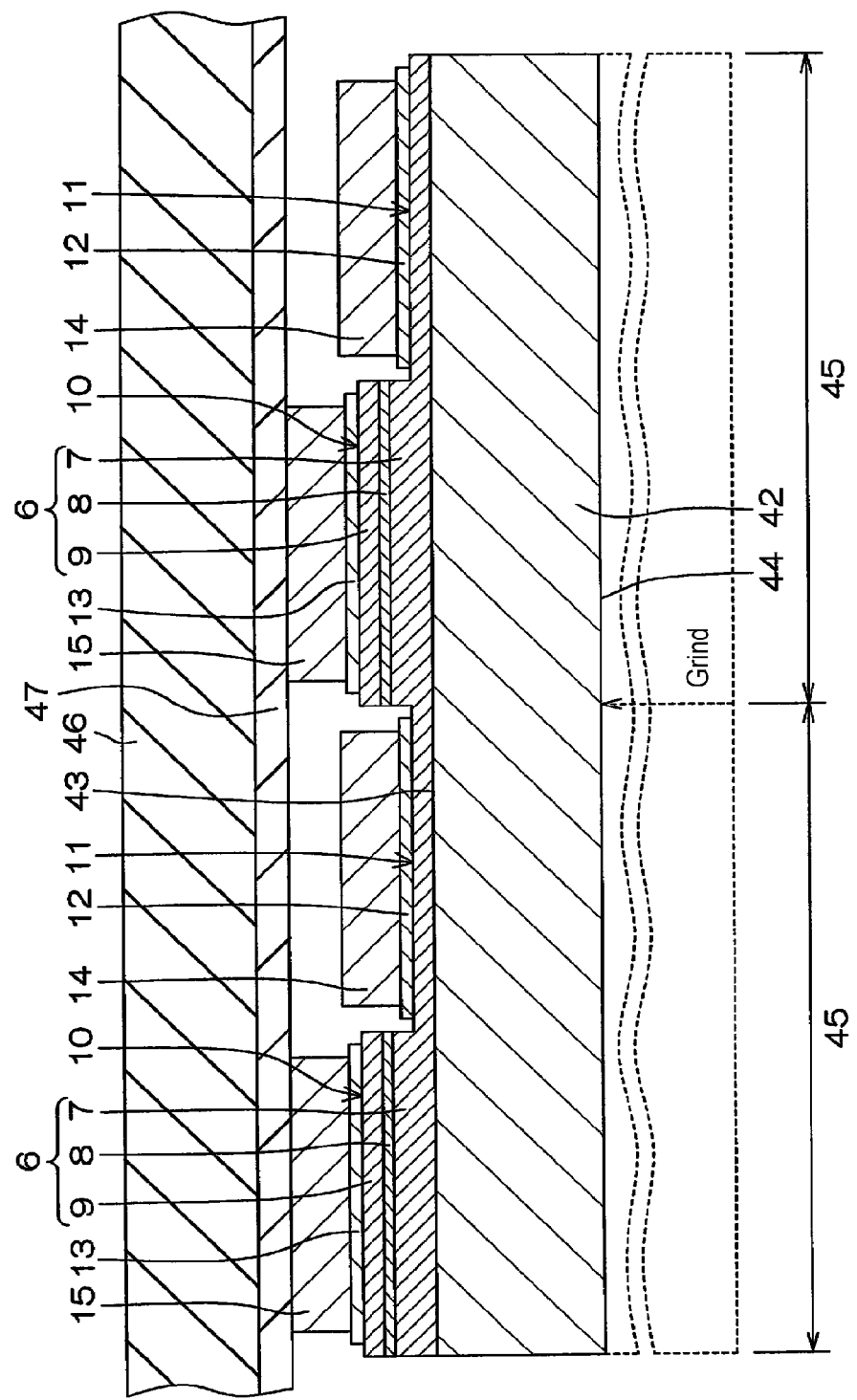

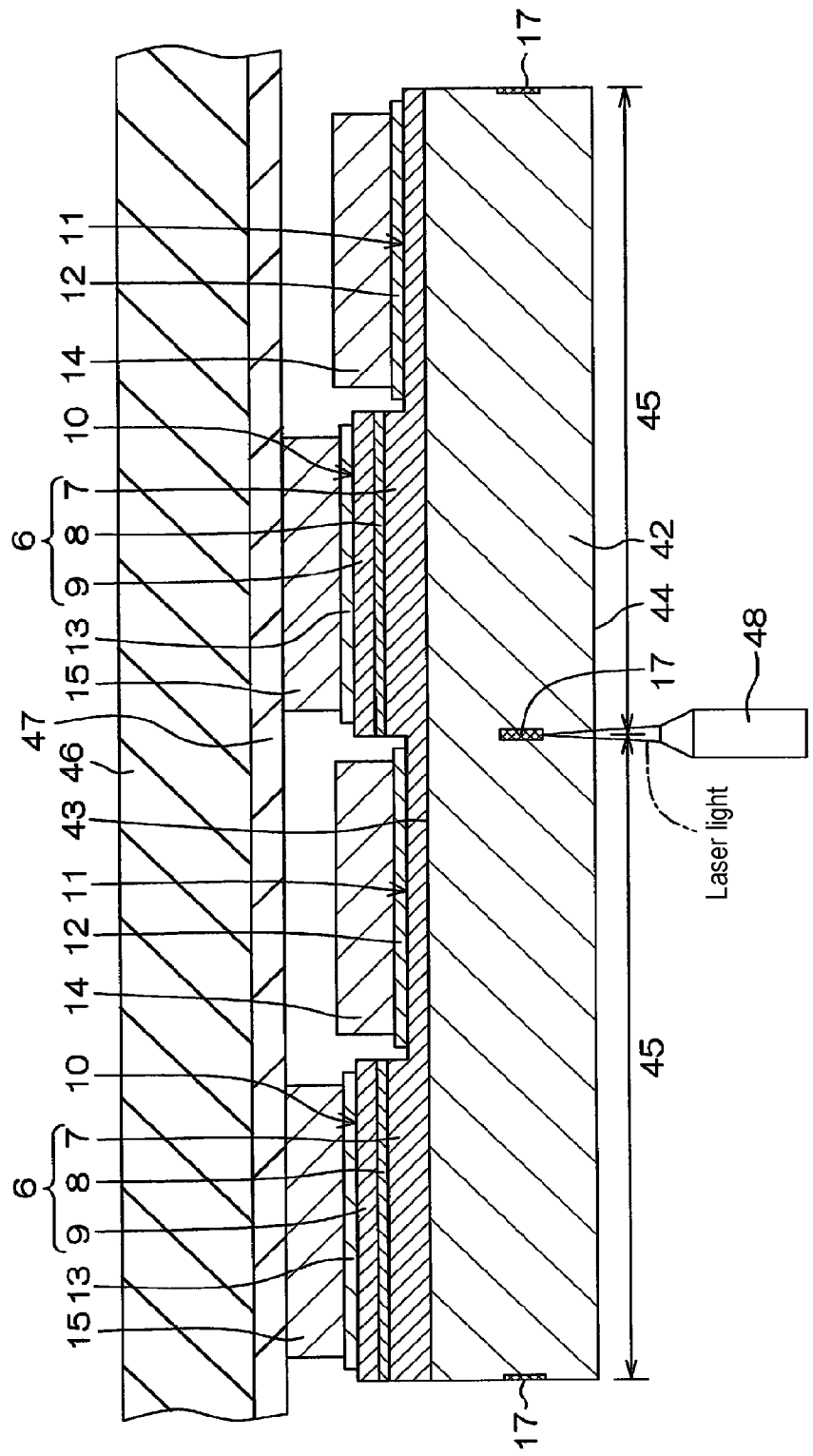

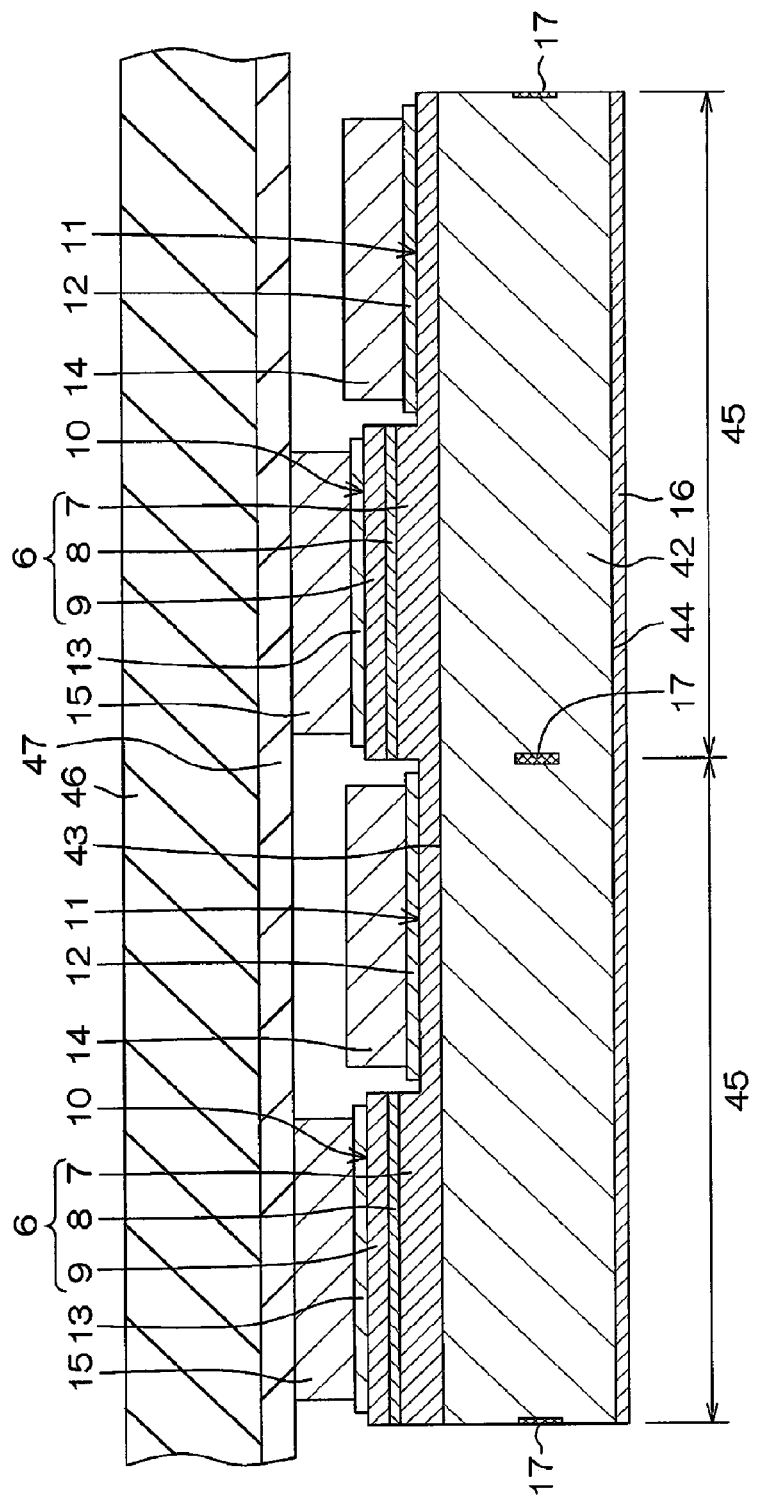

SEMICONDUCTOR LIGHT EMITTING ELEMENT AND MANUFACTURING METHOD THEREOF

CROSS-REFERENCE TO RELATED APPLICATION

This application is based upon and claims the benefit of priority from Japanese Patent Application No. 2016-111145, filed on Jun. 2, 2016, the entire contents of which are incorporated herein by reference.

TECHNICAL FIELD

The present disclosure relates to a semiconductor light emitting element and a manufacturing method thereof.

BACKGROUND

A light emitting element (semiconductor light emitting element) includes a substrate, a semiconductor layer formed on a surface of the substrate, a reflective film (light reflective layer) that covers an inner portion of a rear surface of the substrate so as to expose an edge portion of the rear surface of the substrate, and a modified layer formed on a side surface of the substrate. Such a light emitting device may be manufactured through the following process.

First, a semiconductor layer is formed on a surface of a wafer, and a reflective film is formed on a rear surface of the wafer. Next, an unnecessary portion of the reflective film is removed by a cutting blade, and a groove is formed in the reflective film to expose the rear surface of the wafer. Subsequently, laser light is irradiated toward the rear surface of the wafer exposed from the groove of the reflective film to form a modified layer in the wafer. Thereafter, the substrate is divided using the modified layer as an origination to form a plurality of light emitting devices as individual pieces.

In the semiconductor light emitting element, it is required to prepare a device having a back aligner (cutting blade) for removing the light reflective layer, increasing not only the cost of facility investment but also the number of manufacturing processes of the semiconductor light emitting element. Therefore, there is a problem that the cost for the semiconductor light emitting element increases. In addition, since the light reflective layer is formed to expose the edge portion of the rear surface of the substrate, the semiconductor light emitting element as manufactured may have a portion where no light reflective layer is present on the rear surface of the substrate. Due to this, the light generated by the semiconductor layer is not reflected toward the semiconductor layer but is emitted to the outside through the portion where no light reflective layer is present. Thus, there is a problem that the brightness is lowered due to loss of light.

SUMMARY

The present disclosure provides some embodiments of a method of manufacturing a semiconductor light emitting element capable of desirably improving brightness while suppressing an increase in cost.

The present disclosure further provides some embodiments of a semiconductor light emitting element manufactured by the method of manufacturing a semiconductor light emitting element.

According to one embodiment of the present disclosure, there is provided a method of manufacturing a semiconductor light emitting element, including: forming a semiconductor layer, which generates light, on a first surface of a wafer that includes the first surface and a second surface; forming, selectively in the wafer, a modified layer having a physical property different from that of the other portion of the wafer by selectively irradiating laser light from the second surface of the wafer with a light concentration point aimed at a region spaced apart from the first surface toward the second surface in the wafer so as to alter a material forming the wafer; after the act of forming the modified layer, forming a light reflective layer, which is configured to reflect the light generated by the semiconductor layer toward the semiconductor layer, on the second surface of the wafer; and partitioning a plurality of semiconductor light emitting elements in individual pieces by dividing the wafer together with the light reflective layer using the modified layer as a cutting point.

According to another embodiment of the present disclosure, there is provided a semiconductor light emitting element, a substrate including a first surface, a second surface opposite to the first surface, and a side surface that connects the first surface and the second surface; a semiconductor layer formed on the first surface of the substrate and configured to generate light; and a light reflective layer formed on the second surface of the substrate to cover an entire region of the second surface of the substrate and configured to reflect the light generated by the semiconductor layer toward the semiconductor layer, wherein a modified layer, which has a physical property different from that of the other portion of the substrate, is formed on the side surface of the substrate to be spaced apart from the first surface toward the second surface by altering a material forming the substrate.

BRIEF DESCRIPTION OF THE DRAWINGS

FIG. 4 is a process view illustrating a process of a method of manufacturing the semiconductor light emitting element of FIG. 1.

FIG. 5A is a longitudinal sectional view illustrating one of processes of manufacturing the semiconductor light emitting element of FIG. 1.

FIG. 5C is a longitudinal sectional view illustrating a next process of FIG. 5B.

FIG. 5E is a longitudinal sectional view illustrating a next process of FIG. 5D.

FIG. 5F is a longitudinal sectional view illustrating a next process of FIG. 5E.

FIG. 5G is a longitudinal sectional view illustrating a next process of FIG. 5F.

DETAILED DESCRIPTION

Embodiments of the present disclosure will be now described in detail with reference to the drawings.

First Embodiment

Figure 1:
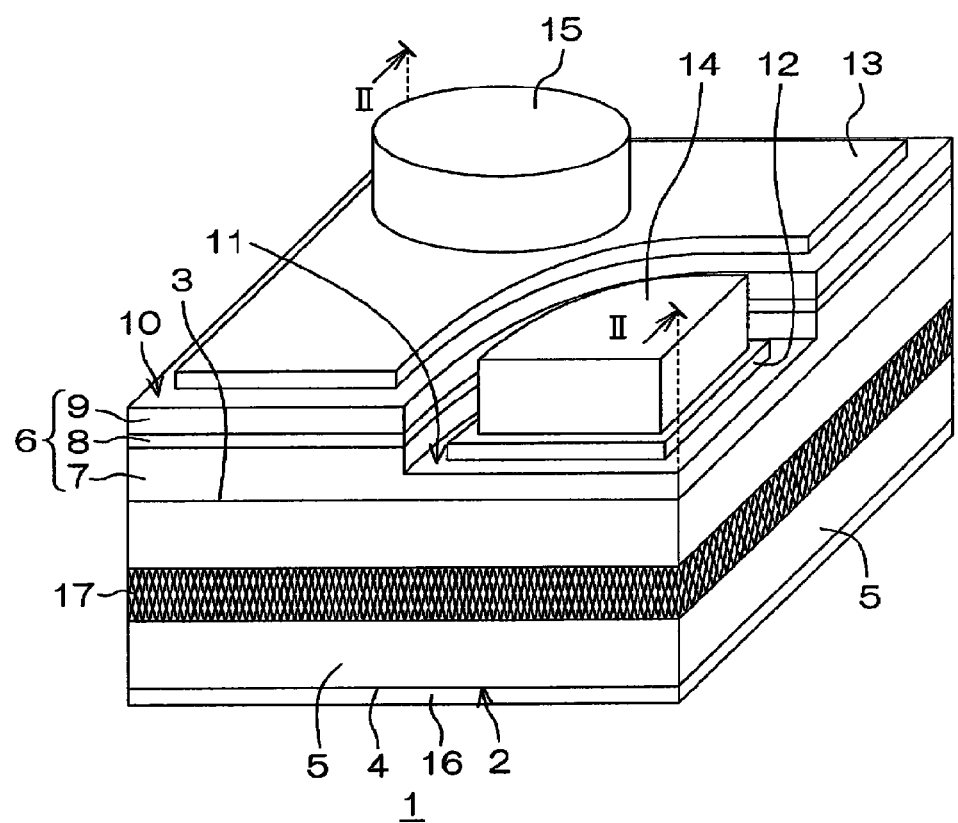
FIG. 1 is a perspective view of a semiconductor light emitting element according to a first embodiment of the present disclosure.
Figure 2:
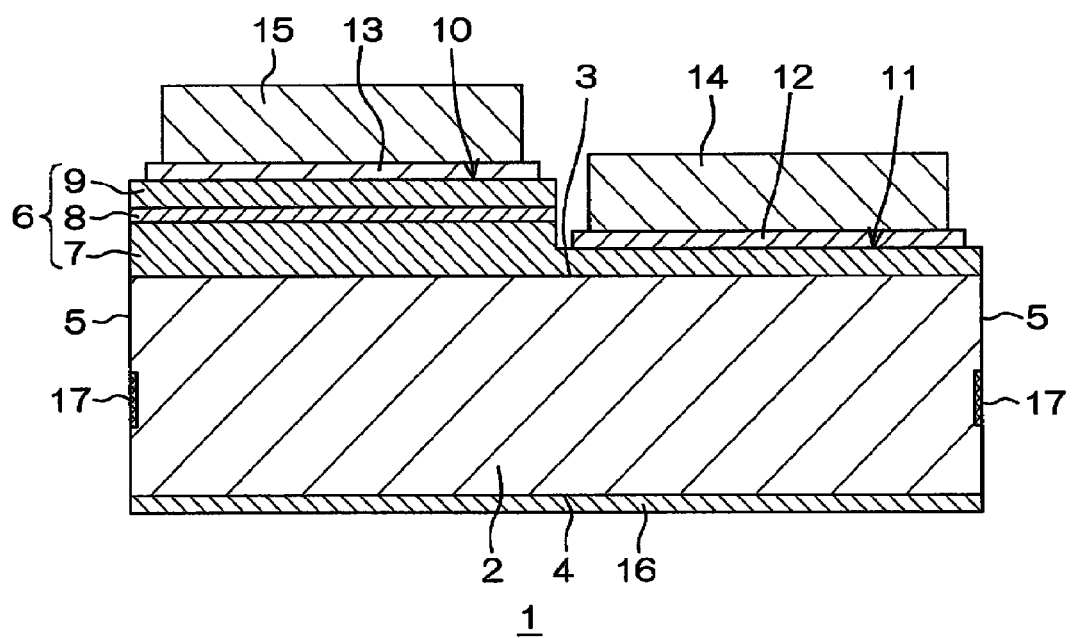
FIG. 2 is a longitudinal sectional view taken along line II-II of FIG. 1.

FIG. 1 is a perspective view of a semiconductor light emitting element 1 according to a first embodiment of the present disclosure. FIG. 2 is a longitudinal sectional view taken along line II-II of FIG. 1.

As illustrated in FIGS. 1 and 2, the semiconductor light emitting element 1 according to this embodiment includes a light transmissive substrate 2 having a rectangular parallelepiped shape. The substrate 2 may be a sapphire substrate. The substrate 2 has a surface 3, an opposite surface 4 that is opposite to the surface 3, and four side surfaces 5 that connect the surface 3 and the opposite surface 4. An epitaxial layer 6, which is an example of a semiconductor layer configured to generate light of the present disclosure, is formed on the surface 3 of the substrate 2.

The epitaxial layer 6 is formed on the surface 3 of the substrate 2 so as to cover an entire region of the surface 3 of the substrate 2. The epitaxial layer 6 includes a first semiconductor layer 7 of an n-type, a light emitting layer 8, and a second semiconductor layer 9 of a p-type which are laminated in this order from the surface 3 of the substrate 2. All of the first semiconductor layer 7, the light emitting layer 8, and the second semiconductor layer 9 may include a group III nitride semiconductor. The first semiconductor layer 7, the light emitting layer 8, and the second semiconductor layer 9 may include a gallium nitride (GaN).

The epitaxial layer 6 has a mesa structure 10 formed by selectively cutting away a portion of the first semiconductor layer 7, the light emitting layer 8, and the second semiconductor layer 9 so as to expose the first semiconductor layer 7, and an outer region 11 which is an outward region of the mesa structure 10 and in which the first semiconductor layer 7 is exposed. The outer region 11 has a single layer structure formed of the first semiconductor layer 7 and is formed in a fan shape at one corner portion of the surface 3 of the substrate 2 in a plane view. On the other hand, the mesa structure 10 is formed in an L shape so as to surround the outer region 11 in the plane view.

A first contact electrode 12 electrically connected to the first semiconductor layer 7 and a second contact electrode 13 electrically connected to the second semiconductor layer 9 are disposed on the epitaxial layer 6. The first contact electrode 12 and the second contact electrode 13 are transparent electrodes containing, for example, zinc oxide (ZnO) or indium tin oxide (ITO).

The first contact electrode 12 is bonded to the outer region 11 at a distance from the mesa structure 10 and the side surface 5 of the substrate 2. In this embodiment, the first contact electrode 12 is formed in a fan shape substantially similar to that of the outer region 11 in the plane view. On the other hand, the second contact electrode 13 is bonded to the second semiconductor layer 9 of the mesa structure 10 spaced at a distance from the outer region 11 and the side surface 5 of the substrate 2. In this embodiment, the second contact electrode 13 is formed in an L shape substantially similar to that of the mesa structure 10 in the plane view. Also, the second contact electrode 13 is not limited to the L shape in the plane view, and may be formed in a quadrangular shape or any other shape in the plane view.

A first external terminal 14 electrically connected to the first semiconductor layer 7 is disposed on the first contact electrode 12, and a second external terminal 15 electrically connected to the second semiconductor layer 9 is disposed on the second contact electrode 13. The first external terminal 14 and the second external terminal 15 are disposed to be spaced apart from each other along one diagonal line of the substrate 2. The first external terminal 14 and the second external terminal 15 may contain gold (Au).

In this embodiment, the first external terminal 14 is formed in a fan-like columnar shape substantially similar to that of the first contact electrode 12 in the plane view. Also, the first external terminal 14 is not limited to the fan-like columnar shape, and may be formed in a quadrangular columnar shape, a cylindrical shape, or any other shape. In this embodiment, the second external terminal 15 is formed in a columnar shape (a cylindrical shape in this embodiment). The second external terminal 15 is not limited to the cylindrical shape, and may also be formed in a fan-like columnar shape, a quadrangular columnar shape, or any other shape.

A light reflective layer 16 configured to reflect light generated by the epitaxial layer 6 (light emitting layer 8) toward the epitaxial layer 6 is formed adjacent to the surface 4 of the substrate 2 so as to cover an entire region of the opposite surface 4 of the substrate 2. The light reflective layer 16 may have a single layer structure formed of a single metal film or may have a laminated structure in which a plurality of metal films are laminated. The light reflective layer 16 may be formed of one or two or more kinds of metal films selected from the group including aluminum (Al), gold (Au), and silver (Ag).

The light reflective layer 16 may also be an insulating layer having a laminated structure in which a plurality of insulating films having different refractive indices are laminated. The light reflective layer 16 may be a distributed Bragg reflector (DBR) layer having a laminated structure in which insulating films having different refractive indices are alternately laminated by an optical length of ¼ wavelength. The DBR layer may be formed of two or more kinds of insulating films selected from the group including $ZrO_2$, $Al_2O_3$, $SiO_2$, $TiO_2$, $Ta_2O_5$, $Nb_2O_5$, AlN, SiN, AlON, and SiON.

In addition, the light reflective layer 16 may have a laminated structure including both a metal plate and an insulating film (DBR layer). In this case, the light reflective layer 16 may have a laminated structure including a metal plate and an insulating film (DBR layer) from the opposite surface 4 of the substrate 2 or may have a laminated structure including an insulating film (DBR layer) and a metal film from the opposite surface 4 of the substrate 2.

Referring to FIGS. 1 and 2, the semiconductor light emitting element 1 according to this embodiment includes a modified layer 17 which is formed at a position spaced apart from the surface 3 toward the opposite surface 4 on the side surface 5 of the substrate 2. The modified layer 17 has a physical property different from those of other regions due to alternation of a material forming the substrate 2.

Further, the "alteration" means that the crystalline state is different from those of other regions. In addition, the "modified layer 17" refers to a layer whose density, refractive index, mechanical strength (crystal strength), or other physical properties are different from those of other regions due to alteration. For example, the modified layer 17 includes a melted recurred layer which has been melted and then recurred, a defective layer including a hole or crack, a dielectric breakdown layer caused by dielectric breakdown, a refractive index changed layer having a refractive index different from those of other regions, a layer including a mixture of these layers, and the like. In this embodiment, the modified layer 17 may be a machining mark (laser machining mark) formed by irradiation of laser light.

The modified layer 17 is formed in a band shape along the side surface 5 of the substrate 2 so as to extend in a direction parallel to the surface 3 and the opposite surface 4 of the substrate 2, and surrounds an inner region of the substrate 2. In this embodiment, the modified layer 17 is formed to be spaced apart from the surface 3 and the opposite surface 4 of the substrate 2. The light reflective layer 16 covers an entire region of the opposite surface 4 of the substrate 2. Thus, the modified layer 17 faces the light reflective layer 16 over the entire periphery of the substrate 2 in the plane view. Further, the modified layer 17 may not necessarily be continuously formed over the entire periphery of the substrate 2 and may be intermittently formed along the side surface 5 of the substrate 2.

In this configuration, the epitaxial layer 6 is formed of a uniform material adjacent to the surface 3 of the substrate 2. That is, in the epitaxial layer 6, all of the first semiconductor layer 7, the light emitting layer 8, and the second semiconductor layer 9 are formed of a uniform material adjacent to the surface 3 of the substrate 2. When the epitaxial layer 6 is made of a uniform material, it means that the epitaxial layer 6 is formed in a uniform crystalline state adjacent to the surface 3 of the substrate 2, without being completely or totally affected by alteration of a material of the substrate 2 in the modified layer 17. For example, as a distance between the modified layer 17 and the surface 3 of the substrate 2 is set to become 10 μm or more, it is possible to effectively suppress or prevent an influence of alteration of a material of the substrate 2 in the modified layer 17 on the epitaxial layer 6.

Further, the light reflective layer 16 is formed of a uniform material adjacent to the opposite surface 4 of the substrate 2. When the light reflective layer 16 is formed of a uniform material, it means that the light reflective layer 16 is formed in a uniform crystalline state adjacent to the opposite surface 4 of the substrate 2, without being completely or totally affected by alteration of a material of the substrate 2 in the modified layer 17.

Figure 3:
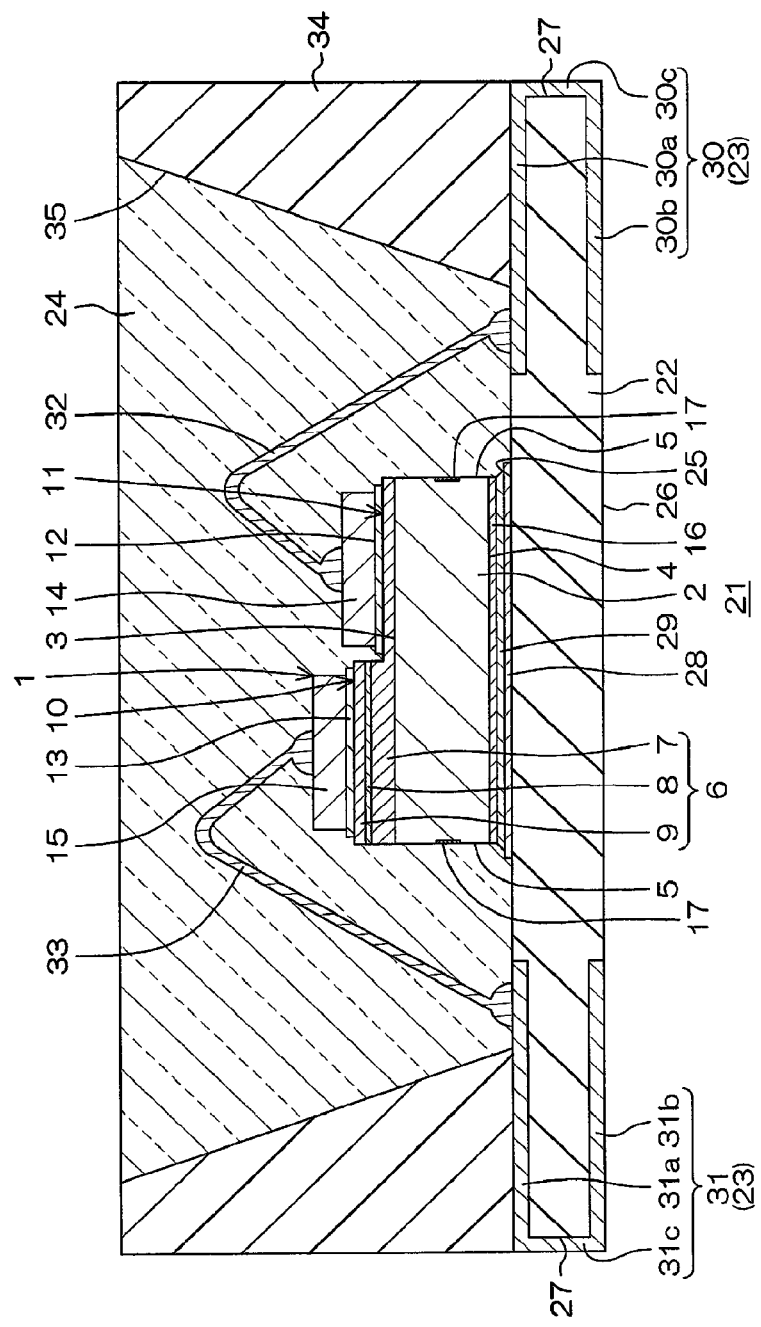
FIG. 3 is a longitudinal sectional view of a light emitting device package on which the semiconductor light emitting element of FIG. 1 is mounted.

As illustrated in FIG. 3, the semiconductor light emitting element 1 is mounted on a light emitting device package 21. FIG. 3 is a longitudinal sectional view of the light emitting device package 21 on which the semiconductor light emitting element 1 of FIG. 1 is mounted. As illustrated in FIG. 3, the light emitting device package 21 includes the semiconductor light emitting element 1 described above, a support substrate 22 for supporting the semiconductor light emitting element 1, a plurality of terminal electrode films 23 electrically connected to the semiconductor light emitting element 1, and a sealing resin 24 configured to seal the semiconductor light emitting element 1.

In this embodiment, the support substrate 22 is formed in a rectangular parallelepiped shape and includes an upper surface 25 on which the semiconductor light emitting element 1 is disposed, a lower surface 26, which is a mounting electrode surface positioned on the opposite of the upper surface 25, and four side surfaces 27 that connect the upper surface 25 and the lower surface 26. A die pad 28 to which the semiconductor light emitting element 1 is bonded is disposed at the center of the upper surface 25 of the support substrate 22. The semiconductor light emitting element 1 is supported by the support substrate 22 by bonding the light reflective layer 16 and the die pad 28 via an adhesive 29 in a state that the opposite surface 4 faces the upper surface 25 of the support substrate 22.

The terminal electrode films 23 include a first terminal electrode film 30 electrically connected to the first semiconductor layer 7 of the semiconductor light emitting element 1 and a second terminal electrode film 31 electrically connected to the second semiconductor layer 9 of the semiconductor light emitting element 1. The first terminal electrode film 30 is disposed on one side surface 27 of the support substrate 22, and the second terminal electrode film 31 is disposed on side surface 27 opposing the side surface 27 of the support substrate 22 where the first terminal electrode film 30 is formed.

The first terminal electrode film 30 and the second terminal electrode film 31 have upper surface electrode films 30a and 31a installed on the upper surface 25 of the support substrate 22, lower surface electrode films 30b and 31b installed on the lower surface 26 of the support substrate 22, and connection portions 30c and 31c for connecting the upper surface electrode films 30a and 31a and the lower surface electrode films 30b and 31b, respectively. In FIG. 3, there is illustrated an example that the connection portions 30c and 31c are connection electrode films installed on the side surfaces 27 of the support substrate 22, but the connection portions 30c and 31c may also be configured to connect electrically the upper surface electrode films 30a and 31a and the lower surface electrode films 30b and 31b via electrodes through the support substrate 22.

The first terminal electrode film 30 is electrically connected to the semiconductor light emitting element 1 by electrically connecting the first external terminal 14 and the upper surface electrode film 30a via, for example, a conductive wire 32 such as a bonding wire. The second terminal electrode film 31 is electrically connected to the semiconductor light emitting element 1 by electrically connecting the second external terminal 15 and the upper surface electrode film 31a via, for example, a conductive wire 33 such as a bonding wire.

A frame member 34 that surrounds the semiconductor light emitting element 1 is installed on the upper surface 25 of the support substrate 22. The frame member 34 has an inclined portion 35 that is inclined upwardly away from the semiconductor light emitting element 1. The frame member 34 may also be a reflective plate configured to being installed with the support substrate 22 or may be installed as a separate member. The frame member 34 may contain, for example, a white resin.

The sealing resin 24 fills a space surrounded by the frame member 34 so as to seal the semiconductor light emitting element 1 on the upper surface 25 of the support substrate 22. The sealing resin 24 may be made of a transparent resin and may contain, for example, silicon, an acrylic resin, or an epoxy resin.

The light emitting device package 21 is manufactured by mounting the semiconductor light emitting element 1 on the support substrate 22 and then supplying the sealing resin 24 into the space defined by the support substrate 22 and the frame member 34. Further, the light emitting device package 21 may also have a configuration in which the semiconductor light emitting element 1 is sealed by the sealing resin 24 on the support substrate 22, without the frame member 34. The configuration may be manufactured by supplying the sealing resin 24 into the support substrate 22 so as to seal the semiconductor light emitting element 1 by, for example, a molding method using a mold.

Next, an example of a method of manufacturing the semiconductor light emitting element 1 according to this embodiment will be described. FIG. 4 is a process view illustrating a process of a method of manufacturing the semiconductor light emitting element 1 of FIG. 1. FIGS. 5A to 5H are longitudinal sectional views illustrating one of processes of manufacturing the semiconductor light emitting element 1 of FIG. 1. FIGS. 5A to 5H illustrate longitudinal sectional views of a portion where two semiconductor light emitting elements 1 are manufactured. Hereinafter, a region in which the semiconductor light emitting element 1 is formed will be referred to as an element formation region 45.

Figure 5B:
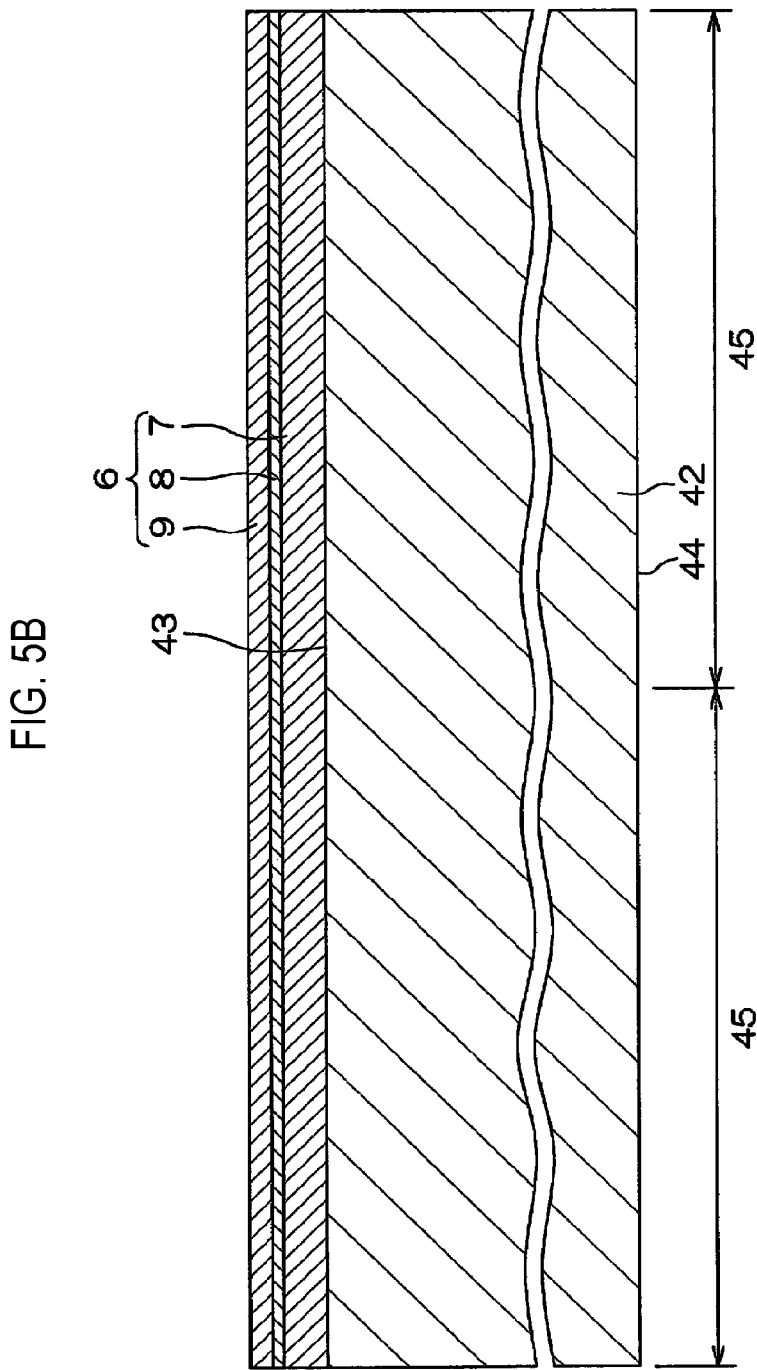
FIG. 5B is a longitudinal sectional view illustrating a next process of FIG. 5A.

In manufacturing the semiconductor light emitting element 1, first, referring to FIG. 5A, a wafer 42 is prepared (step S1 of FIG. 4). The wafer 42 is a single crystal sapphire wafer as a basis of the substrate 2, and has one surface 43 and opposite surface 44 respectively corresponding to surface 3 and opposite surface 4 of the substrate 2. Next, referring to FIG. 5B, an first semiconductor layer 7 of a first conductivity type which is served as an n-type, a light emitting layer 8, and a second semiconductor layer 9 of a second conductivity type which is served as a p-type are sequentially formed adjacent to the one surface 43 of the wafer 42 by an epitaxial growth method (step S2 of FIG. 4). Thus, an epitaxial layer 6 is formed adjacent to the one surface 43 of the wafer 42 to cover an entire region of the surface 43 of the wafer 42.

Subsequently, referring to FIG. 5C, a portion of the first semiconductor layer 7 and unnecessary portions of the light emitting layer 8 and the second semiconductor layer 9 are selectively removed by, for example, etching through a mask (step S3 of FIG. 4). Thus, the epitaxial layer 6 including a mesa structure 10 and an outer region 11 is formed in each element formation region 45. The mesa structure 10 is formed by selectively cutting away a portion of the first semiconductor layer 7 and the light emitting layer 8 and the second semiconductor layer 9.

Figure 5D:
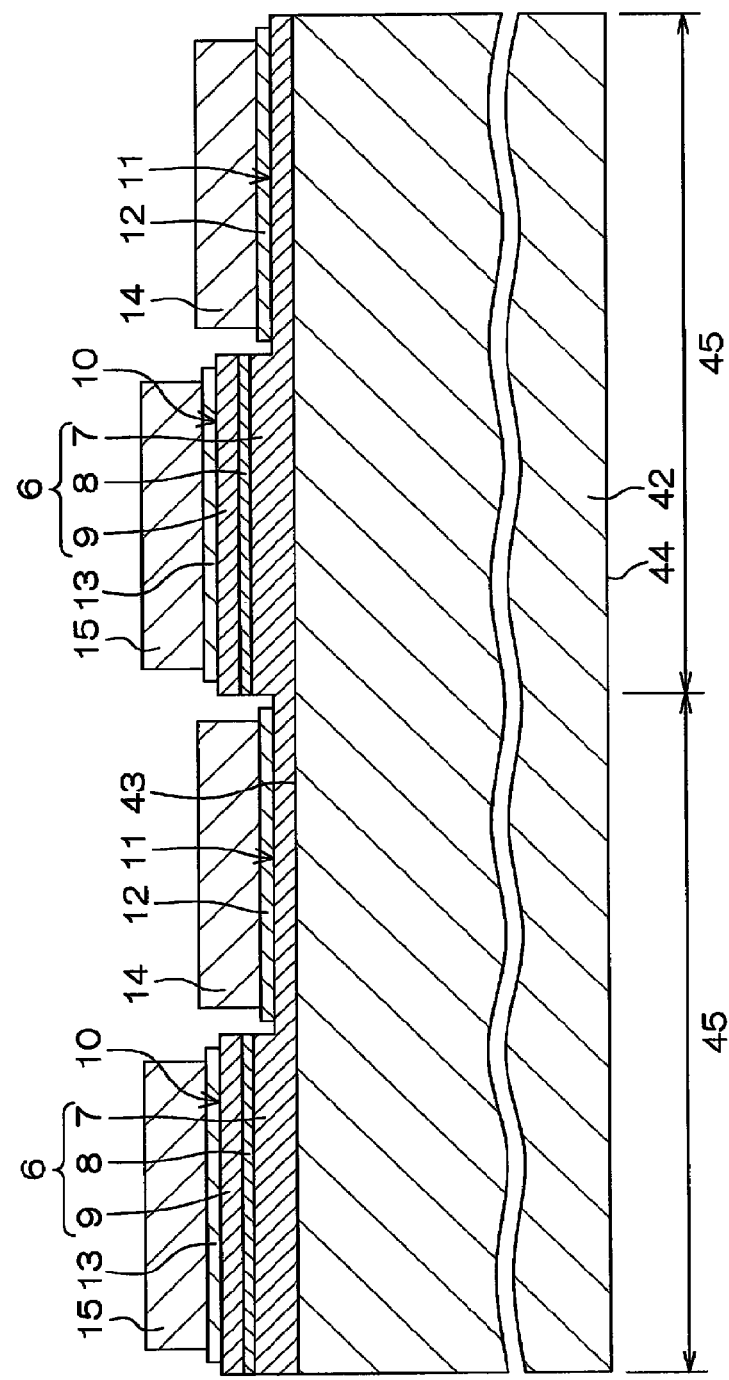
FIG. 5D is a longitudinal sectional view illustrating a next process of FIG. 5C.

Thereafter, referring to FIG. 5D, for example, by a sputtering method, a transparent conductive material as a first contact electrode 12 and a second contact electrode 13, is formed to be a transparent conductive material layer (step S4 of FIG. 4) deposited on the epitaxial layer. Next, the transparent conductive material layer is selectively patterned by, for example, etching through a mask, to form the first contact electrode 12 and the second contact electrode 13 in each element formation region 45.

Subsequently, a first external terminal 14 is formed on the first contact electrode 12, a second external terminal 15 is formed on the second contact electrode 13 by, for example, a lift-off method (step S5 of FIG. 4). More specifically, a mask is formed on the epitaxial layer 6, and the mask selectively has openings in regions in which the first external terminal 14 and the second external terminal 15 are to be formed. Next, a conductive material (e.g., gold (Au)) as the first external terminal 14 and the second external terminal 15 is deposited to fill the openings by, for example, a sputtering method. Thereafter, the first external terminal 14 and the second external terminal 15 are simultaneously formed by removing the mask.

Subsequently, referring to FIG. 5E, a support member 46, which fixedly supports the wafer 42 from the one surface 43 of the wafer 42, is bonded to the wafer 42. In this embodiment, the support member 46 is bonded to the wafer 42 via an adhesive tape 47. The support member 46 may also be bonded so as to be in close contact with the wafer 42 via an adhesive wax, instead of the adhesive tape 47.

Further, the support member 46 may be any member as long as it can be peeled off from the wafer 42 in a later process. The support member 46 may be a silicon substrate, a glass substrate, or a metal (e.g., copper or stainless steel) substrate, or may be a tape member having sufficient strength to support the wafer 42.

Subsequently, the opposite surface 44 of the wafer 42 is ground and simultaneously smoothened or mirrored by, for example, a chemical mechanical polishing (CMP) method, until the thickness of the wafer 42 reaches a desired thickness (step S6 of FIG. 4).

Next, referring to FIG. 5F, laser light is irradiated into the wafer 42 using a laser light irradiation device 48 (step S7 of FIG. 4). More specifically, a light concentration point (e.g., focal point) is aimed at a region spaced apart from the one surface 43 to the opposite surface 44 within the wafer 42, and the laser light is irradiated from the opposite surface 44 of the wafer 42. The laser light is irradiated into the wafer 42 so as to partition each element formation region 45. At this time, since the opposite surface 44 of the wafer 42 is smoothened or mirrored, the laser light can be desirably irradiated into the wafer 42.

By such a laser light irradiation process, A material (sapphire) forming the wafer 42 is altered, and the modified layer 17 having a physical property different from those of other regions is formed in the wafer 42. More specifically, in this embodiment, the modified layer 17 is a laser machining mark due to irradiation of laser light, and is formed at a position spaced apart from the one surface 43 of the wafer 42 toward the opposite surface 44. The modified layer 17 has a crystal strength lower than that of at least other regions, and a dividing origination (e.g., cutting point) for dividing the wafer 42 is formed by the modified layer 17.

Next, referring to FIG. 5G, a conductive material or an insulating material is selectively deposited on the opposite surface 44 of the wafer 42 by, for example, a CVD method, a sputtering method, or a deposition method, so that a light reflective layer 16 is formed (step S8 of FIG. 4). The light reflective layer 16 is formed adjacent to the opposite surface 44 of the wafer 42 so as to cover, for example, an entire or a substantially entire region of the surface 44 of the wafer 42.

In this process, the light reflective layer 16 having a single layer structure formed of one metal film may be formed or the light reflective layer 16 having a laminated structure in which a plurality of metal films are laminated may be formed. The light reflective layer 16 having a laminated structure in which a plurality of insulating films having different refractive indices are laminated may also be formed. As the light reflective layer 16, a DBR layer having a laminated structure in which the insulating films having different refractive indices are alternately laminated by an optical field of ¼ wavelength may be formed. The light reflective layer 16 having a laminated structure including both a metal plate and an insulating film (DBR layer) may also be formed.

Figure 5H:
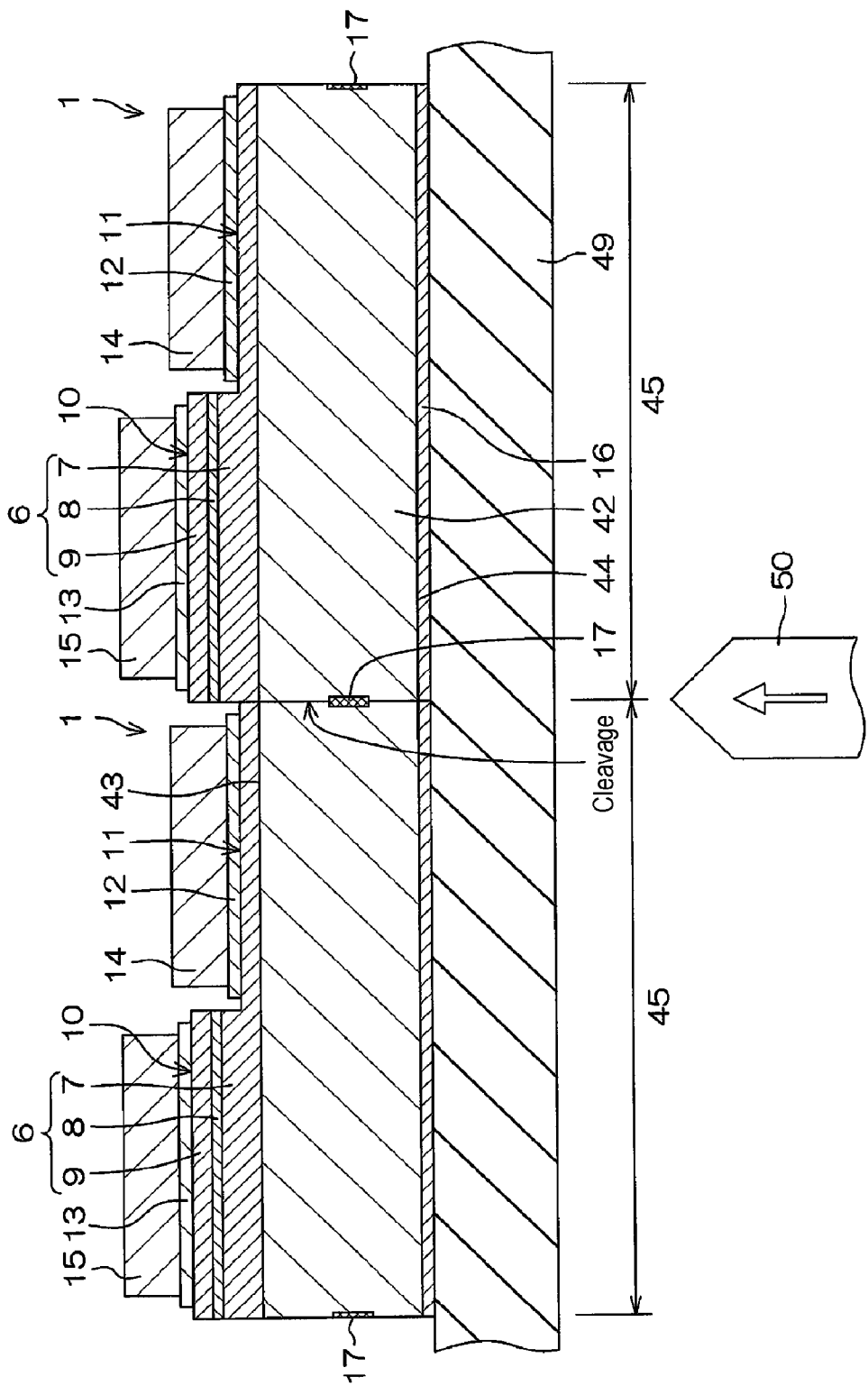
FIG. 5H is a longitudinal sectional view illustrating a next process of FIG. 5G.

Next, referring to FIG. 5H, the support member 46 is peeled off and a flexible tape member 49 for supporting the wafer 42 is bonded to the opposite surface 44 of the wafer 42. Subsequently, an external force is applied to the modified layer 17 from the opposite surface 44 of the wafer 42 through the tape member 49 by, for example, a cleavage blade 50 or the like, so that the wafer 42 is cleaved (divided) together with the epitaxial layer 6 and the light reflective layer 16 using the modified layer 17 as a dividing origination (e.g., cutting point). Thus, individual pieces of the semiconductor light emitting elements 1 are cut out from the wafer 42.

In addition, in this embodiment, there has been described the example in which an external force is applied to the modified layer 17 from the opposite surface 44 of the wafer 42, but the tape member 49 may also be bonded to the one surface 43 of the wafer 42 and an external force may be applied to the modified layer 17 from the one surface 43 of the wafer 42.

As described above, in the method of manufacturing the semiconductor light emitting element 1 according to this embodiment, after the modified layer forming process (step S7 of FIG. 4), the light reflective layer 16 is formed adjacent to the opposite surface 44 of the wafer 42 (step S8 of FIG. 4), and the wafer 42 is cleaved (divided) together with the epitaxial layer 6 and the light reflective layer 16 using the modified layer 17 as a dividing origination (e.g., cutting point) (step S9 of FIG. 4). The divided wafer 42 becomes the substrate 2 forming part of the semiconductor light emitting element 1. Thus, it is possible to manufacture the semiconductor light emitting element 1 having a configuration in which the entire region of the surface 4 of the substrate 2 is covered by the light reflective layer 16 without removing the light reflective layer 16.

It is unnecessary to execute the process of removing the light reflective layer 16 and also unnecessary to separately prepare a device for removing the light reflective layer 16, thus it is possible to reduce the cost for the semiconductor light emitting element 1.

For example, a method of irradiating laser light to the substrate 2 through the light reflective layer 16, without removing the light reflective layer 16, may also be considered. In this case, however, since a portion of the laser light may be reflected by the light reflective layer 16 or the light reflective layer 16 may be a barrier, it is concerned that the modified layer 17 cannot be desirably formed in the wafer 42. On the other hand, according to the manufacturing method of this embodiment, since the light reflective layer 16 is formed after the modified layer forming process (step S7 of FIG. 4), laser light cannot be irradiated to the substrate 2 through the light reflective layer 16. Thus, since the modified layer 17 can be desirably formed in the wafer 42, the semiconductor light emitting element 1 can be desirably divided into individual pieces.

Further, since the light reflective layer 16 is formed after the modified layer forming process (step S7 of FIG. 4), the light reflective layer 16 is not damaged by irradiation of laser light. Therefore, the light reflective layer 16 can be formed of a uniform material adjacent to the opposite surface 44 of the wafer 42. Thus, since the light reflective layer 16 can be formed such that the light reflective layer 16 can desirably reflect light generated by the epitaxial layer 6 (light emitting layer 8), it is possible to desirably improve the brightness.

Furthermore, according to the manufacturing method of this embodiment, since laser light is irradiated from the opposite surface 44 of the wafer 42 with a light concentration point aimed at a region spaced apart from the one surface 43 toward the opposite surface 44 in the wafer 42, the epitaxial layer 6 can be formed of a uniform material adjacent to the one surface 43 of the wafer 42. Thus, since the epitaxial layer 6 can desirably generate light, it is also possible to desirably improve the brightness from such a viewpoint.

In addition, the method of manufacturing the semiconductor light emitting element 1 according to this embodiment includes a process of bonding the support member 46 to the one surface 43 of the wafer 42 prior to the polishing process (step S6 of FIG. 4). It is possible that the wafer 42 is thinned by the polishing process so that strength of the wafer 42 is lowered. However, according to the method for manufacturing the semiconductor light emitting element 1 of this embodiment, the wafer 42 can be fixedly supported by the support member 46. Thus, it is possible to desirably execute the polishing process (step S6 of FIG. 4). Moreover, by fixedly supporting the wafer 42 by the support member 46, it is possible to desirably execute also the processes after the polishing process (step S6 of FIG. 4), i.e., the modified layer forming process (step S7 of FIG. 40) or the light reflective layer forming process (step S8 of FIG. 4).

Second Embodiment

Figure 6:
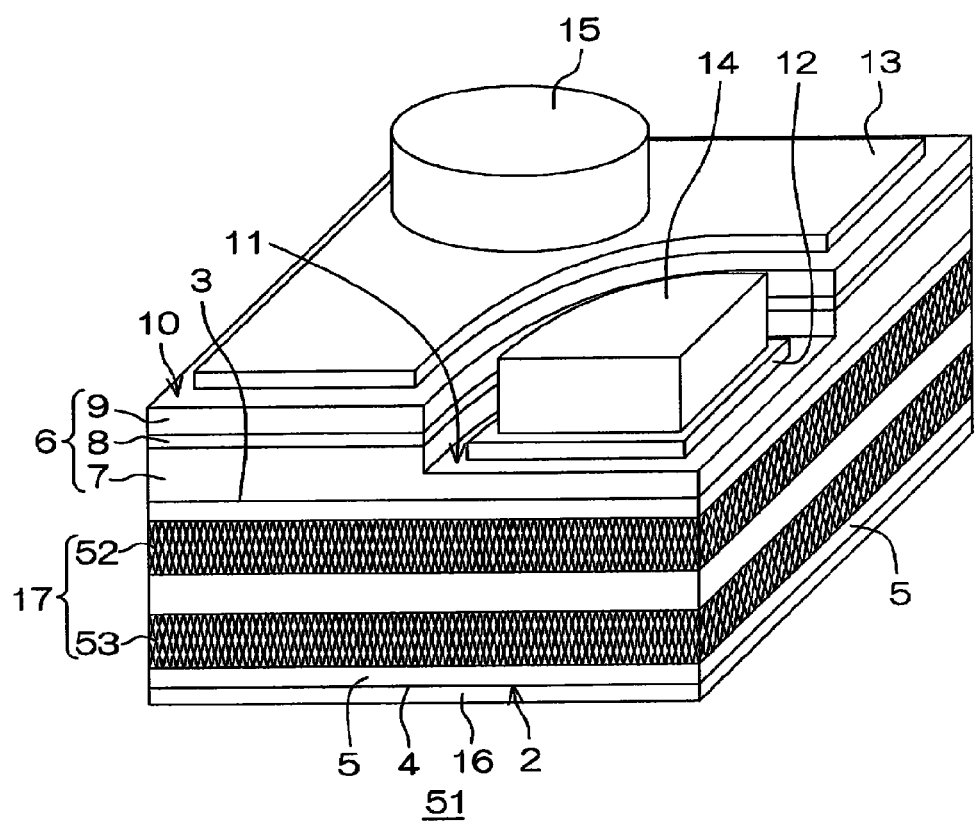
FIG. 6 is a perspective view of a semiconductor light emitting element according to a second embodiment of the present disclosure.

FIG. 6 is a perspective view of a semiconductor light emitting element 51 according to a second embodiment of the present disclosure. In FIG. 6, the same components as those of the first embodiment described above will be denoted by the same reference numerals and descriptions thereof will be omitted.

Referring to FIG. 6, the modified layer 17 according to this embodiment includes a first modified layer 52 formed adjacent to surface 3 of the substrate 2 and a second modified layer 53 formed adjacent to the opposite surface 4 of the substrate 2. The first modified layer 52 and the second modified layer 53 are formed to be spaced apart from each other. Both of the first modified layer 52 and the second modified layer 53 are formed in a band shape along the side surface 5 of the substrate 2 so as to extend in a direction parallel to the surface 3 and the opposite surface 4 of the substrate 2, and surround an inner region of the substrate 2.

The first modified layer 52 is formed at a position spaced apart from the surface 3 toward the opposite surface 4 of the substrate 2. The second modified layer 53 is formed at a position spaced apart from the opposite surface 4 toward the surface 3 of the substrate 2. Further, the first modified layer 52 and the second modified layer 53 may not necessarily be continuously formed over the entire periphery of the substrate 2 and may be intermittently formed along the side surface 5 of the substrate 2.

The modified layer 17 including the first modified layer 52 and the second modified layer 53 may be formed by irradiating laser light to different positions of the wafer 42 in a thickness direction following multiple stages irradiation (two-stage irradiation in this embodiment) in the modified layer forming process (step S7 of FIG. 4) described above. Even with this configuration, the same advantages as those of the first embodiment described above may be achieved.

Third Embodiment

Figure 7:
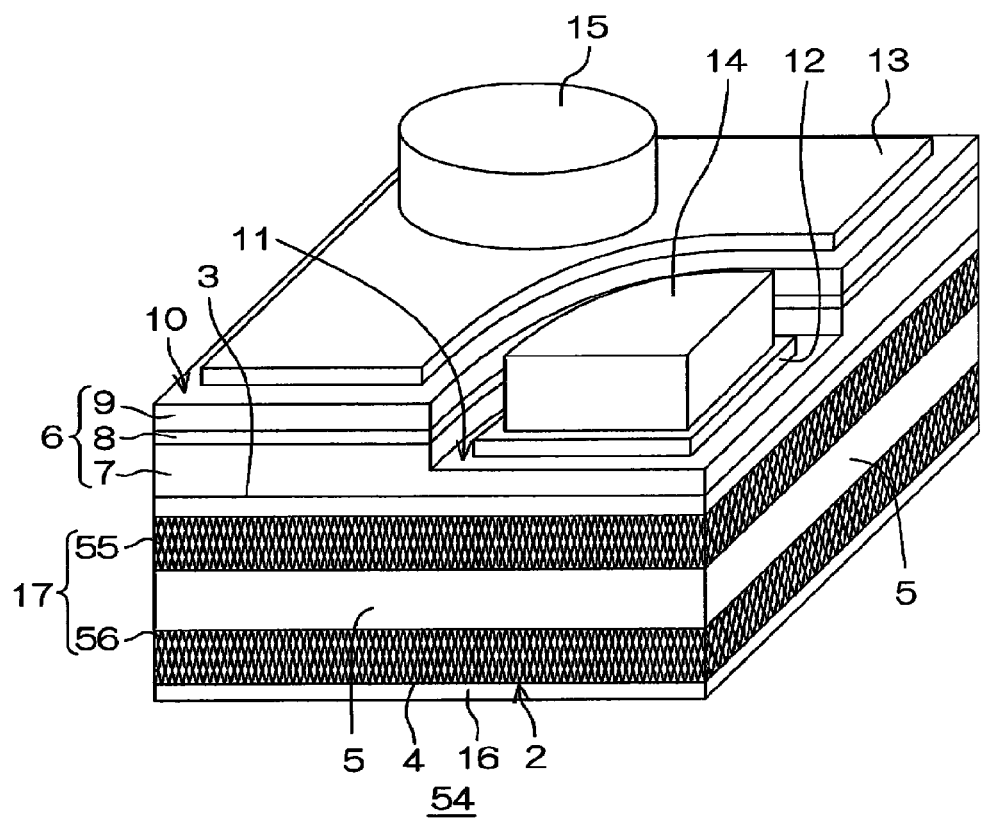
FIG. 7 is a perspective view of a semiconductor light emitting element according to a third embodiment of the present disclosure.

FIG. 7 is a perspective view of a semiconductor light emitting element 54 according to a third embodiment of the present disclosure. In FIG. 7, the same components as those of the first embodiment described above will be denoted by the same reference numerals and descriptions thereof will be omitted.

Referring to FIG. 7, the modified layer 17 according to this embodiment includes a first modified layer 55 formed adjacent to surface 3 of the substrate 2 and a second modified layer 56 formed adjacent to opposite surface 4 of the substrate 2. The first modified layer 55 and the second modified layer 56 are formed to be spaced apart from each other. Both of the first modified layer 55 and the second modified layer 56 are formed in a band shape along the side surface 5 of the substrate 2 so as to extend in a direction parallel to the surface 3 and the opposite surface 4 of the substrate 2, and surround an inner region of the substrate 2.

The first modified layer 55 is formed at a position spaced apart from the surface 3 toward the opposite surface 4 of the substrate 2. The second modified layer 56 is formed so as to be exposed from the opposite surface 4 of the substrate 2. The light reflective layer describe above 16 is in contact with the second modified layer 56 on the opposite surface 4 of the substrate 2. Further, the first modified layer 55 and the second modified layer 56 may not necessarily be continuously formed over the entire periphery of the substrate 2 and may be intermittently formed along the side surface 5 of the substrate 2.

The modified layer 17 including the first modified layer 55 and the second modified layer 56 may be formed by irradiating laser light to different positions of the wafer 42 in a thickness direction following multiple stages irradiation (two-stage irradiation in this embodiment) in the modified layer forming process (step S7 of FIG. 4) described above. Even with this configuration, the same advantages as those of the first embodiment described above may be achieved.

Fourth Embodiment

Figure 8:
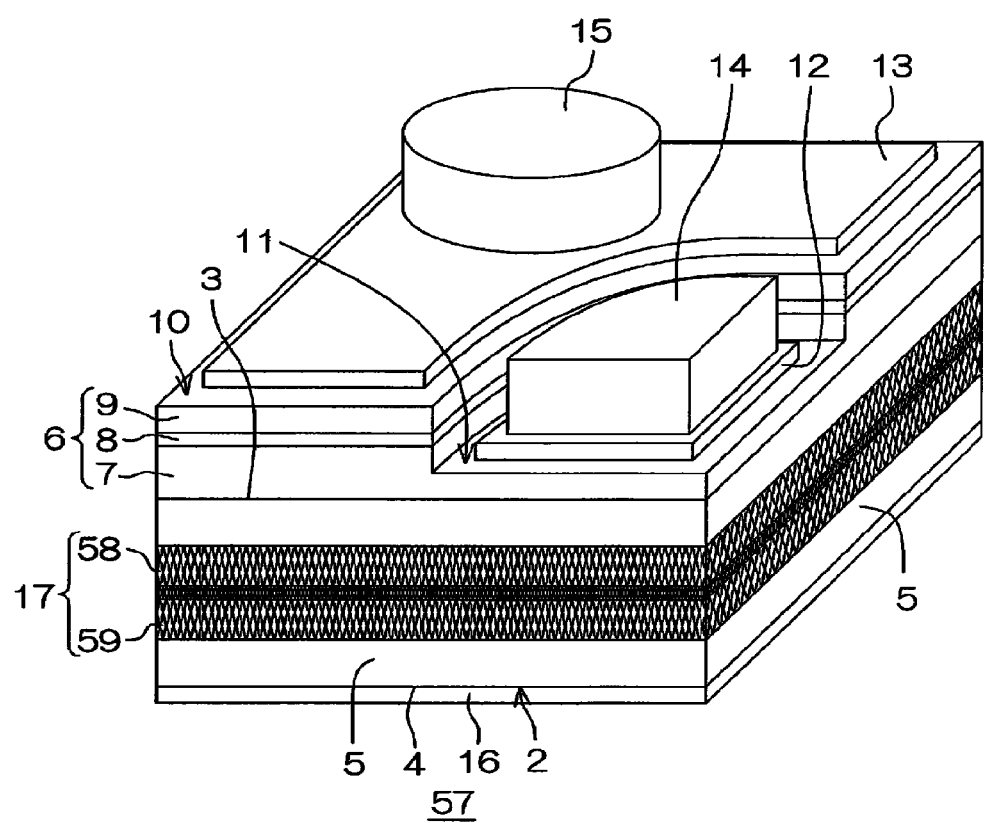
FIG. 8 is a perspective view of a semiconductor light emitting element according to a fourth embodiment of the present disclosure.

FIG. 8 is a perspective view of a semiconductor light emitting element 57 according to a fourth embodiment of the present disclosure. In FIG. 8, the same components as those of the first embodiment described above will be denoted by the same reference numerals and descriptions thereof will be omitted.

Referring to FIG. 8, the modified layer 17 according to this embodiment includes a first modified layer 58 formed adjacent to surface 3 of the substrate 2 and a second modified layer 59 formed adjacent to opposite surface 4 of the substrate 2. The first modified layer 58 and the second modified layer 59 are formed so as to overlap each other in a thickness direction of the substrate 2. Both of the first modified layer 58 and the second modified layer 59 are formed in a band shape along the side surface 5 of the substrate 2 so as to extend in a direction parallel to the surface 3 and the opposite surface 4 of the substrate 2, and surround an inner region of the substrate 2. That is, the modified layer 17 according to this embodiment has a band-shaped overlapping portion in which the first modified layer 58 and the second modified layer 59 overlap each other.

The first modified layer 58 is formed at a position spaced apart from the surface 3 toward the opposite surface 4 of the substrate 2. The second modified layer 59 is formed at a position spaced apart from the opposite surface 4 toward the surface 3 of the substrate 2. Further, the first modified layer 58 and the second modified layer 59 may not necessarily be continuously formed over the entire periphery of the substrate 2 and may be intermittently formed along the side surface 5 of the substrate 2.

The modified layer 17 including the first modified layer 58 and the second modified layer 59 may be formed by irradiating laser light to different positions of the wafer 42 in a thickness direction in multiple stages irradiation (two-stage irradiation in this embodiment) in the modified layer forming process (step S7 of FIG. 4) described above. Even with this configuration, the same advantages as those of the first embodiment described above may be achieved.

Fifth Embodiment

Figure 9:
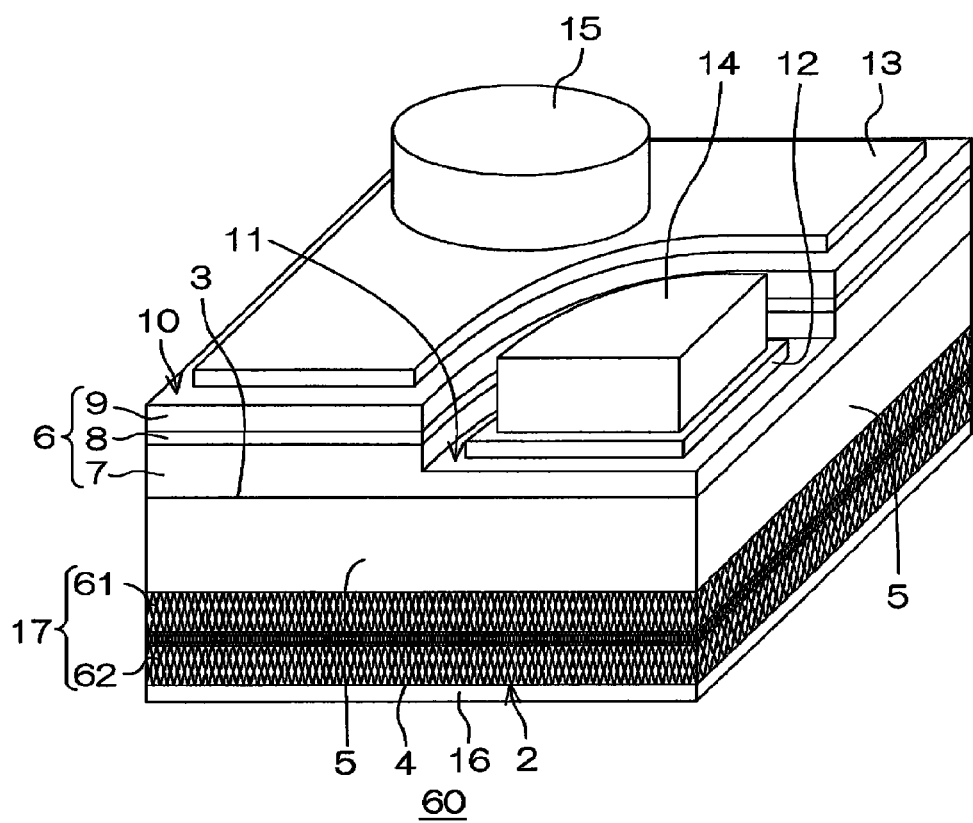
FIG. 9 is a perspective view of a semiconductor light emitting element according to a fifth embodiment of the present disclosure.

FIG. 9 is a perspective view of a semiconductor light emitting element 60 according to a fifth embodiment of the present disclosure. In FIG. 9, the same components as those of the first embodiment described above will be denoted by the same reference numerals and descriptions thereof will be omitted.

Referring to FIG. 9, the modified layer 17 according to this embodiment includes a first modified layer 61 formed adjacent to surface 3 of the substrate 2 and a second modified layer 62 formed adjacent to opposite surface 4 of the substrate 2. The first modified layer 61 and the second modified layer 62 are formed so as to overlap each other in a thickness direction of the substrate 2. Both of the first modified layer 61 and the second modified layer 62 are formed in a band shape along the side surface 5 of the substrate 2 so as to extend in a direction parallel to the surface 3 and the opposite surface 4 of the substrate 2, and surround an inner region of the substrate 2. That is, the modified layer 17 according to this embodiment has a band-shaped overlapping portion in which the first modified layer 61 and the second modified layer 62 overlap each other.

The first modified layer 61 is formed at a position spaced apart from the surface 3 toward the opposite surface 4 of the substrate 2. The second modified layer 62 is formed so as to be exposed from the opposite surface 4 of the substrate 2. Further, the first modified layer 61 and the second modified layer 62 may not necessarily be continuously formed over the entire periphery of the substrate 2 and may be intermittently formed along the side surface 5 of the substrate 2.

The modified layer 17 including the first modified layer 61 and the second modified layer 62 may be formed by irradiating laser light to different positions of the wafer 42 in a thickness direction in multiple stages irradiations (two-stage irradiation in this embodiment) in the modified layer forming process (step S7 of FIG. 4) described above. Even with this configuration, the same advantages as those of the first embodiment described above may be achieved.

Sixth Embodiment

Figure 10:
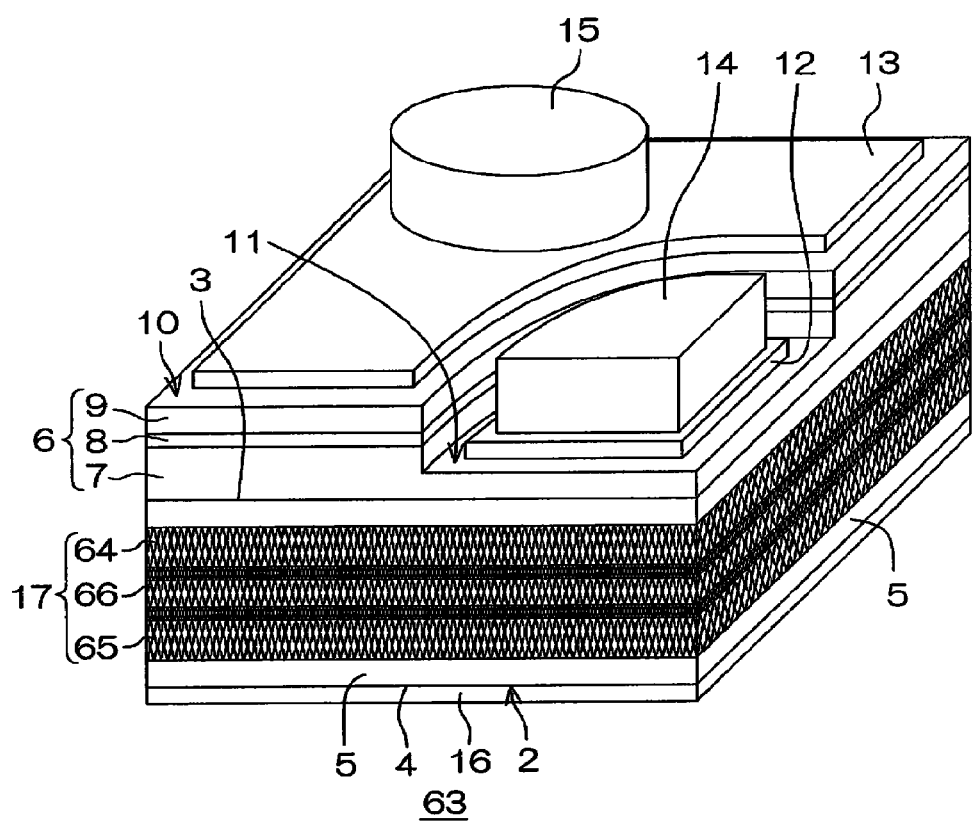
FIG. 10 is a perspective view of a semiconductor light emitting element according to a sixth embodiment of the present disclosure.

FIG. 10 is a perspective view of a semiconductor light emitting element 63 according to a sixth embodiment of the present disclosure. In FIG. 10, the same components as those of the first embodiment described above will be denoted by the same reference numerals and descriptions thereof will be omitted.

Referring to FIG. 10, the modified layer 17 according to this embodiment includes a first modified layer 64 formed adjacent to surface 3 of the substrate 2, a second modified layer 65 formed adjacent to opposite surface 4 of the substrate 2, and an intermediate modified layer 66 formed between the first modified layer 64 and the second modified layer 65. The first modified layer 64 and the intermediate modified layer 66 are formed so as to overlap each other in a thickness direction of the substrate 2. The intermediate modified layer 66 and the second modified layer 65 are formed so as to overlap each other in a thickness direction of the substrate 2.

All of the first modified layer 64, the second modified layer 65, and the intermediate modified layer 66 are formed in a band shape along the side surface 5 of the substrate 2 so as to extend in a direction parallel to the surface 3 and the opposite surface 4 of the substrate 2, and surround an inner region of the substrate 2. That is, the modified layer 17 according to this embodiment has a first band-shaped overlapping portion in which the first modified layer 64 and the intermediate modified layer 66 overlap each other, and a second band-shaped overlapping portion in which the intermediate modified layer 66 and the second modified layer 65 overlap each other.

The first modified layer 64 is formed at a position spaced apart from the surface 3 toward the opposite surface 4 of the substrate 2. The second modified layer 65 is formed at a position spaced apart from the opposite surface 4 toward the surface 3 of the substrate 2. Further, the first modified layer 64, the second modified layer 65, and the intermediate modified layer 66 may not necessarily be continuously formed over the entire periphery of the substrate 2 and may be intermittently formed along the side surface 5 of the substrate 2.

The modified layer 17 including the first modified layer 64, the second modified layer 65, and the intermediate modified layer 66 may be formed by irradiating laser light to different positions of the wafer 42 in a thickness direction in multiple stages irradiation (two-stage irradiation in this embodiment) in the modified layer forming process (step S7 of FIG. 4) described above. Even with this configuration, the same advantages as those of the first embodiment described above may be achieved.

Further, in this embodiment, there has been described the example in which the intermediate modified layer 66 as one layer is formed between the first modified layer 64 and the second modified layer 65, but a plurality of intermediate modified layers 66 may be formed between the first modified layer 64 and the second modified layer 65. In addition, the intermediate modified layer 66 may be formed to be spaced apart from the first modified layer 64 between the first modified layer 64 and the second modified layer 65, or may be formed to be spaced apart from the second modified layer 65 between the first modified layer 64 and the second modified layer 65.

Seventh Embodiment

Figure 11:
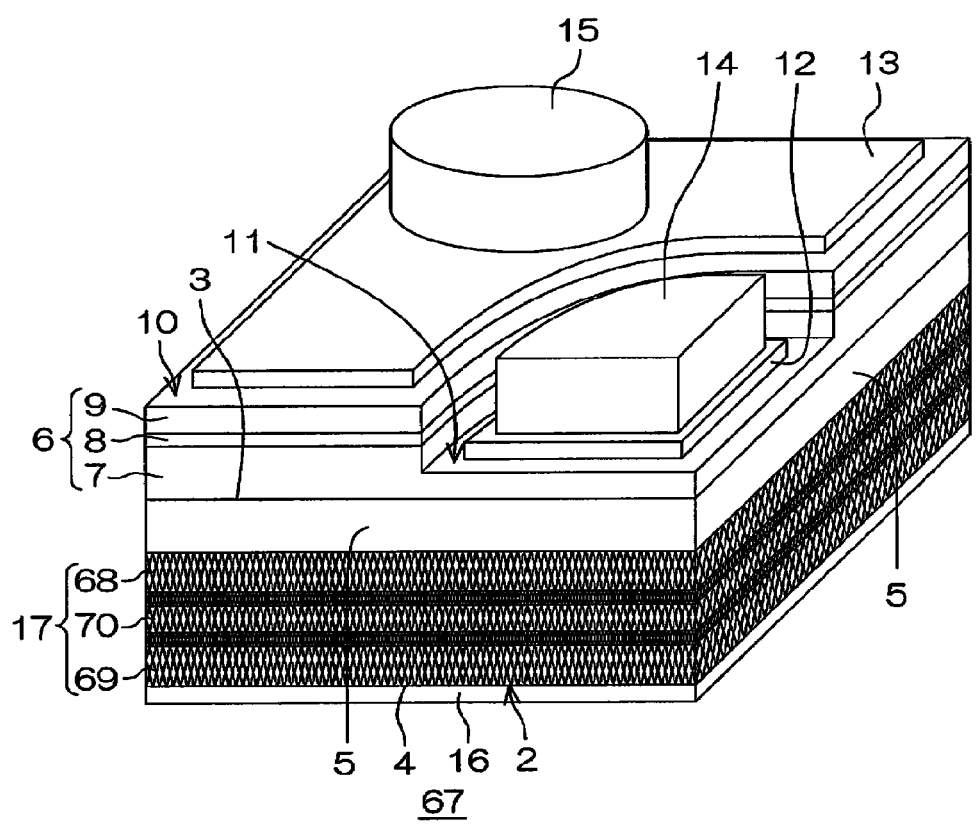
FIG. 11 is a perspective view of a semiconductor light emitting element according to a seventh embodiment of the present disclosure.

FIG. 11 is a perspective view of a semiconductor light emitting element 67 according to a seventh embodiment of the present disclosure. In FIG. 11, the same components as those of the first embodiment described above will be denoted by the same reference numerals and descriptions thereof will be omitted.

Referring to FIG. 11, the modified layer 17 according to this embodiment includes a first modified layer 68 formed adjacent to surface 3 of the substrate 2, a second modified layer 69 formed adjacent to the opposite surface 4 of the substrate 2, and an intermediate modified layer 70 formed between the first modified layer 68 and the second modified layer 69. The first modified layer 68 and the intermediate modified layer 70 are formed so as to overlap each other in a thickness direction of the substrate 2. The intermediate modified layer 70 and the second modified layer 69 are formed so as to overlap each other in a thickness direction of the substrate 2.

The first modified layer 68, the second modified layer 69, and the intermediate modified layer 70 are all formed in a band shape along the side surface 5 of the substrate 2 so as to extend in a direction parallel to the surface 3 and the opposite surface 4 of the substrate 2, and surround an inner region of the substrate 2. That is, the modified layer 17 according to this embodiment has a first band-shaped overlapping portion in which the first modified layer 68 and the intermediate modified layer 70 overlap each other, and a second band-shaped overlapping portion in which the intermediate modified layer 70 and the second modified layer 69 overlap each other.

The first modified layer 68 is formed at a position spaced apart from the surface 3 toward the opposite surface 4 of the substrate 2. The second modified layer 69 is formed so as to be exposed from the opposite surface 4 of the substrate 2. Further, the first modified layer 68, the second modified layer 69, and the intermediate modified layer 70 may not necessarily be continuously formed over the entire periphery of the substrate 2 and may be intermittently formed along the side surface 5 of the substrate 2.

The modified layer 17 including the first modified layer 68, the second modified layer 69, and the intermediate modified layer 70 may be formed by irradiating laser light to different positions of the wafer 42 in a thickness direction in multiple stages irradiation (two-stage irradiation in this embodiment) in the modified layer forming process (step S7 of FIG. 4) described above. Even with this configuration, the same advantages as those of the first embodiment described above may be achieved.

Further, in this embodiment, there has been described the example in which the intermediate modified layer 70 as one layer is formed between the first modified layer 68 and the second modified layer 69, but a plurality of intermediate modified layers 70 may be formed between the first modified layer 68 and the second modified layer 69. In addition, the intermediate modified layer 70 may be formed to be spaced apart from the first modified layer 68 between the first modified layer 68 and the second modified layer 69, or may be formed to be spaced apart from the second modified layer 69 between the first modified layer 68 and the second modified layer 69.

Eighth Embodiment

Figure 12:
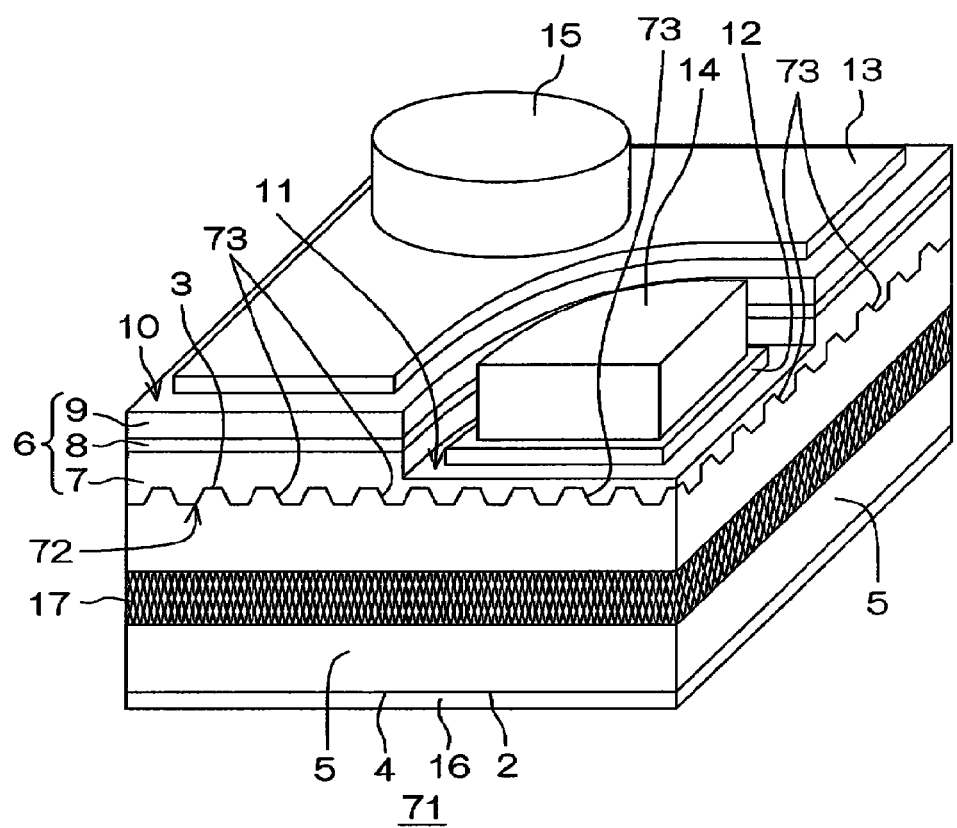
FIG. 12 is a perspective view of a semiconductor light emitting element according to an eighth embodiment of the present disclosure.

FIG. 12 is a perspective view of a semiconductor light emitting element 71 according to an eighth embodiment of the present disclosure. In FIG. 12, the same components as those of the first embodiment described above will be denoted by the same reference numerals and descriptions thereof will be omitted.

Referring to FIG. 12, irregularities 72 are formed over the entire of the surface 3 of the substrate 2 according to this embodiment, and thus, the substrate 2 may be a patterned sapphire substrate (PSS). The irregularities 72 include a plurality of regularly arranged protruding portions 73 having a convex shape. The protruding portions 73 may be arranged in a matrix form or may be arranged in a zigzag manner. Of course, the protruding portions 73 may also be arranged discretely without regularity. According to the substrate 2 formed of PSS, since light generated by the epitaxial layer (light emitting layer 8) can be reflected to the epitaxial layer 6 by the irregularities 72 in addition to the light reflective layer 16, it is possible to improve the brightness.

The substrate 2 formed of PSS may be formed by selectively removing a portion of the one surface 43 of the wafer 42 by, for example, etching through a mask, after the wafer 42 preparation process (step S1 of FIG. 4) and prior to the epitaxial layer forming process (step S2 of FIG. 4) described above.

In the wafer 42 in which the irregularities 72 are formed on the one surface 43, when laser light is irradiated from the one surface 43, since the laser light is reflected by the irregularities 72, it may not be convenient to desirably form the modified layer 17 in the wafer 42. On the other hand, according to the method of manufacturing the semiconductor light emitting element 71 of this embodiment, since laser light is irradiated from the opposite surface 44 of the wafer 42 in the modified layer forming process (step S7 of FIG. 4), the irregularities 72 formed on the one surface 43 of the wafer 42 will not be an obstacle in forming the modified layer 17. It is also possible to effectively suppress the irregularities 72 formed on the one surface 43 of the wafer 42 from being altered due to laser light.

Thus, since a configuration in which the entire region of the surface 4 of the substrate 2 is desirably covered by the light reflective layer 16 and simultaneously the irregularities 72 are desirably formed on the surface 3 of the substrate 2 can be obtained, it is possible to manufacture and provide the semiconductor light emitting element 71 that can effectively improve the brightness.

Furthermore, in this embodiment, there has been described the example in which the irregularities 72 are formed on the surface 3 of the substrate 2 using the substrate 2, but the irregularities 72 may also be formed of a material different from that of the substrate 2. For example, the irregularities 72 may be formed by forming an insulating film on the surface 3 of the substrate 2 and subsequently selectively patterning the insulating film in an irregular shape. Concave portions disposed between protruding portions 73 included in the irregularities 72 may be formed so as to expose the surface 3 of the substrate 2. The insulating film forming the irregularities 72 may contain one or more kinds of insulating materials selected from the group including, for example, $ZrO_2$, $Al_2O_3$, $SiO_2$, $TiO_2$, $Ta_2O_5$, $Nb_2O_5$, AlN, SiN, AlON, and SiON.

The configuration in which the irregularities 72 (protruding portions 73) are formed on the surface 3 of the substrate 2 may also be applied to the second to seventh embodiments described above, as well as to the configuration of the first embodiment.

The embodiments of the present disclosure have been described above. However, the present disclosure may be implemented in different forms.

For example, in each of the embodiments described above, a configuration in which the conductivity type of each semiconductor portion is reversed may also be employed. That is, the p-type portion may become an n-type portion and the n-type portion may become the p-type portion. Thus, an epitaxial layer 6 including a first semiconductor layer 7 of a p-type, a light emitting layer 8, and a second semiconductor layer 9 of an n-type laminated in this order may be formed on the surface 3 of the substrate 2.

Furthermore, in each of the embodiments described above, there has been described the example in which the first external terminal 14 and the second external terminal 15 are disposed to be spaced apart from each other along one diagonal line of the substrate 2. However, the first external terminal 14 and the second external terminal 15 may also be disposed to be spaced apart from each other along a direction in which one side of the substrate 2 extends in the plane view.

In addition, various design changes may be made within the scope of the matters described in claims.

In the method of manufacturing a semiconductor light emitting element of the present disclosure, the light reflective layer is formed on the other surface of the wafer after the modified layer forming process, and the wafer is divided together with the light reflective layer using the modified layer as an origination (e.g., cutting point). The divided wafer becomes the substrate forming a portion of the semiconductor light emitting element. As described above, according to the manufacturing method of the present disclosure, it is possible to manufacture the semiconductor light emitting element having a configuration in which an entire region of the other surface of the substrate is covered by the light reflective layer without removing the light reflective layer. This eliminates the need to perform the process of removing the light reflective layer and eliminates the need to separately prepare a device for removing the light reflective layer, thus reducing the cost for the semiconductor light emitting element.

For example, a method of irradiating laser light to the substrate through the light reflective layer without removing the light reflective layer may also be considered. However, in this method, since a portion of the laser light is reflected by the light reflective layer or the light reflective layer becomes a barrier, there is a possibility that the modified layer cannot be desirably formed in the wafer. On the other hand, according to the method of manufacturing a semiconductor light emitting element of the present disclosure, since the light reflective layer is formed after the modified layer forming process, no laser light is irradiated to the substrate through the light reflective layer. Thus, since the modified layer can be desirably formed in the wafer, the semiconductor light emitting element can be desirably divided into individual pieces.

Further, since the light reflective layer is formed after the modified layer forming process, the light reflective layer is not damaged by irradiation of laser light. Therefore, the light reflective layer can be formed of a uniform material on the other surface of the wafer. Thus, since the light reflective layer that can desirably reflect light generated by the semiconductor layer can be formed, it is possible to desirably improve the brightness.

In addition, according to the method of manufacturing a semiconductor light emitting element of the present disclosure, since laser light is irradiated from the other surface of the wafer with a light concentration point aimed at region spaced apart from the one surface toward the other surface in the wafer, the semiconductor layer can be formed of a uniform material on one surface of the wafer. Thus, since light can be desirably generated by the semiconductor layer, it is possible to desirably improve the brightness also from such a viewpoint.

The semiconductor light-emitting device of the present disclosure is manufactured by using, for example, the method of manufacturing a semiconductor light-emitting device described above. Thus, it is possible to provide the semiconductor light emitting element that can desirably improve the brightness while suppressing an increase in cost.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting element, comprising:
    a substrate having a first physical property and including a top surface, a bottom surface opposite to the top surface, a first side surface, a second side surface, a third side surface, and a fourth side surface;
    a semiconductor layer formed on the top surface of the substrate and configured to generate light; and
    a light reflective layer formed on the bottom surface of the substrate to cover an entire region of the bottom surface of the substrate and configured to reflect the light generated by the semiconductor layer toward the semiconductor layer,
    wherein a modified layer, which has a second physical property different from the first physical property, is formed on the first side surface, the second side surface, the third side surface, and the fourth side surface of the substrate to be spaced apart from the top surface toward the bottom surface by altering a material forming the substrate,
    wherein at least one end portion of the semiconductor layer is exposed,
    wherein the modified layer is formed to be exposed on the first side surface, the second side surface, the third side surface, and the fourth side surface,
    wherein the modified layer includes:
        a first modified layer formed adjacent to the top surface of the substrate;
        a second modified layer formed adjacent to the bottom surface of the substrate; and
        an intermediate modified layer formed between the first modified layer and the second modified layer,
    wherein the second modified layer is exposed from the bottom surface of the substrate, and
    wherein the second modified layer is in contact with the light reflective layer.

2. The semiconductor light emitting element of claim 1, wherein the light reflective layer is formed of a uniform material on the bottom surface of the substrate.

3. The semiconductor light emitting element of claim 1, wherein the semiconductor layer is formed of a uniform material on the top surface of the substrate.

4. The semiconductor light emitting element of claim 1, wherein the semiconductor layer is formed on the top surface of the substrate to cover an entire region of the top surface of the substrate.

5. The semiconductor light emitting element of claim 1, wherein the modified layer is formed in a band shape along the first to the fourth side surfaces of the substrate.

6. The semiconductor light emitting element of claim 1, wherein the modified layer is formed along the first to the fourth side surfaces of the substrate to extend in a direction parallel to the top surface of the substrate.

7. The semiconductor light emitting element of claim 1, wherein the light reflective layer includes a metal film.

8. The semiconductor light emitting element of claim 1, wherein the first modified layer and the intermediate modified layer are formed to overlap each other, and the second modified layer and the intermediate modified layer are formed to overlap each other.

9. The semiconductor light emitting element of claim 1, wherein all side surfaces of the semiconductor layer are exposed.

10. The semiconductor light emitting element of claim 1, wherein the light reflective layer includes an insulating layer.

11. The semiconductor light emitting element of claim 10, wherein the insulating layer has a laminated structure in which a plurality of insulating films having different refractive indices are laminated.

12. The semiconductor light emitting element of claim 1, wherein the modified layer is formed to extend to at least one end portion of each of the first to the fourth side surfaces.

13. The semiconductor light emitting element of claim 12, wherein the modified layer is exposed at the at least one end portion of each of the first to the fourth side surfaces.

14. The semiconductor light emitting element of claim 1, wherein the semiconductor layer includes a first semiconductor layer of a first conductivity type, a light emitting layer, and a second semiconductor layer of a second conductivity type, which are laminated in this order from the top surface of the substrate, and
    wherein the first semiconductor layer, the light emitting layer, and the second semiconductor layer are formed of a uniform material on the top surface of the substrate.

15. The semiconductor light emitting element of claim 14, wherein the first semiconductor layer includes a region that is exposed, and
    wherein the second semiconductor layer includes a region that is exposed.

16. The semiconductor light emitting element of claim 15, wherein the exposed region of the first semiconductor layer includes, in a plan view:
    a first side;
    a second side having a first end connected to a first end of the first side; and
    a curved side having a first end connected to a second end of the first side and having a second end connected to a second end of the second side.

17. The semiconductor light emitting element of claim 15, further comprising a second contact electrode electrically connected to the second semiconductor layer,
    wherein the exposed region of the second semiconductor layer is not covered by the second contact electrode.

18. The semiconductor light emitting element of claim 14, wherein the semiconductor layer is of a mesa structure formed by selectively cutting away a portion of the first semiconductor layer, the light emitting layer, and the second semiconductor layer to expose the first semiconductor layer.

19. The semiconductor light emitting element of claim 18, further comprising a first contact electrode electrically connected to the first semiconductor layer,
    wherein the first contact electrode is disposed to be spaced apart from the mesa structure and the first and the second side surfaces of the substrate in a plan view facing the top surface of the substrate.

20. The semiconductor light emitting element of claim 19, wherein the first contact electrode is disposed to be spaced apart from an edge portion of the first semiconductor layer.

21. The semiconductor light emitting element of claim 19, wherein the first contact electrode includes, in the plan view:

a first side;

a second side having a first end connected to a first end of the first side; and a curved side having a first end connected to a second end of the first side and having a second end connected to a second end of the second side.

22. The semiconductor light emitting element of claim 21, further comprising a first external terminal formed in a region surrounded by the first side, the second side and the curved side of the first contact electrode in the plan view.

23. The semiconductor light emitting element of claim 22, wherein the first external terminal includes, in the plan view:

a first side;

a second side having a first end connected to a first end of the first side; and a curved side having a first end connected to a second end of the first side and having a second end connected to a second end of the second side.

24. The semiconductor light emitting element of claim 18, further comprising a second contact electrode electrically connected to the second semiconductor layer, wherein the second contact electrode is disposed to be spaced apart from a boundary of the mesa structure and the first to the fourth side surfaces of the substrate in a plan view facing the top surface of the substrate.

25. The semiconductor light emitting element of claim 24, wherein the second contact electrode is disposed to be spaced apart from an edge portion of the second semiconductor layer.

26. The semiconductor light emitting element of claim 24, wherein the second contact electrode is not formed over the at least one end portion of the semiconductor layer.

27. The semiconductor light emitting element of claim 24, wherein the second contact electrode includes, in the plan view:

a first side;

a second side having a first end connected to a first end of the first side;

a third side having a first end connected to a second end of the second side;

a fourth side having a first end connected to a second end of the first side; and a curved side having a first end connected to a second end of the third side and having a second end connected to a second end of the fourth side.

28. The semiconductor light emitting element of claim 27, further comprising a second external terminal formed in a region surrounded by the first to the fourth sides and the curved side of the second contact electrode in the plan view.

* * * * *